United States Patent [19]
Ishibashi et al.

[11] Patent Number: 6,165,812
[45] Date of Patent: *Dec. 26, 2000

[54] GALLIUM NITRIDE COMPOUND SEMICONDUCTOR LIGHT EMITTING DEVICE AND PROCESS FOR PRODUCING GALLIUM NITRIDE COMPOUND SEMICONDUCTOR

[75] Inventors: Akihiko Ishibashi, Sakai; Yuuzaburou Ban, Hirakata; Hidemi Takeisi, Fukuoka; Nobuyuki Uemura, Takatsuki; Masahiro Kume, Otsu; Isao Kidoguchi, Kawanishi, all of Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/913,659
[22] PCT Filed: Jan. 14, 1997
[86] PCT No.: PCT/JP97/00056
§ 371 Date: Sep. 19, 1999
§ 102(e) Date: Sep. 19, 1999
[87] PCT Pub. No.: WO97/26680
PCT Pub. Date: Jul. 24, 1997

[30] Foreign Application Priority Data

Jan. 19, 1996 [JP] Japan .................................. 8-007058
Feb. 7, 1996 [JP] Japan .................................. 8-020854

[51] Int. Cl.⁷ .................................................. H01L 21/00
[52] U.S. Cl. .................................................. 438/46; 117/89
[58] Field of Search .......................... 117/3, 89; 438/46; 257/13

[56] References Cited

U.S. PATENT DOCUMENTS

| | | | |
|---|---|---|---|
| 4,590,501 | 5/1986 | Scholl | 357/17 |
| 5,432,808 | 7/1995 | Hatano et al. | 372/45 |
| 5,492,860 | 2/1996 | Ohkubo et al. | 437/133 |
| 5,599,609 | 2/1997 | Manabe et al. | 428/212 |
| 5,700,713 | 12/1997 | Yamazaki et al. | 437/129 |
| 5,751,752 | 5/1998 | Shakuda | 372/45 |

FOREIGN PATENT DOCUMENTS

| | | |
|---|---|---|
| 3-218625 | 9/1991 | Japan . |
| 4-297023 | 10/1992 | Japan . |
| 5-29220 | 2/1993 | Japan . |
| 5-206513 | 8/1993 | Japan . |
| 6-268259 | 9/1994 | Japan . |
| 7-162038 | 6/1995 | Japan . |
| 7-249795 | 9/1995 | Japan . |
| 7-254751 | 10/1995 | Japan . |
| 8-8185 | 1/1996 | Japan . |
| 8-125275 | 5/1996 | Japan . |

OTHER PUBLICATIONS

International Search Report dated May 27, 1997.
Akihiko Ishibashi et al., MOVPE Growth Of High Quality GaN/InGaN Single Quantum Well Structure Using Misoriented SiC Substrate, Extended Abstracts of the 1996 International Conference on Solid State Devices and Materials, Yokohama, Sympo. V–8, 1996, pp. 79–81.

*Primary Examiner*—Olik Chaudhuri
*Assistant Examiner*—Douglas A. Wille
*Attorney, Agent, or Firm*—Ratner & Prestia

[57] ABSTRACT

The method for producing gallium nitride group compound semiconductor includes the steps of: forming a polycrystalline nitride layer 11a in a first temperature range on a substrate 10; forming a nucleus layer 11b of gallium nitride single crystals in a second temperature range on the polycrystalline nitride layer 11a; growing the nucleus layer 11b of gallium nitride single crystals in a third temperature range such that resulting crystals of the nucleus layer 11b of gallium nitride single crystals come into contact with each other in a direction parallel to a surface of the substrate 10; and growing the nucleus layer 11b of gallium nitride single crystals in a fourth temperature range in a direction vertical to the surface of the substrate 10.

25 Claims, 21 Drawing Sheets

(a)

(b)

(c)

(d)

(a)

(b)

(c)

(d)

(a) Present invention (b) Prior art (a)

(b)

(c)

(d)

(a)

1μm (b)

(a) Growth suspended (b) Growth not suspended (a)

(b)

(c)

(d)

GALLIUM NITRIDE COMPOUND SEMICONDUCTOR LIGHT EMITTING DEVICE AND PROCESS FOR PRODUCING GALLIUM NITRIDE COMPOUND SEMICONDUCTOR

This Application is a U.S. National Phase Application of PCT International Application PCT/JP97/00056.

TECHNICAL FIELD

The present invention relates to a gallium nitride group compound semiconductor light-emitting element which emits light in a range from a blue region to an ultraviolet region, and also relates to a method for producing gallium nitride group compound semiconductor used for such a light-emitting element.

BACKGROUND ART

Light-emitting elements which emit light in a wavelength region having a wavelength shorter than that of blue light are expected to be applied as light sources for full-color displays, optical disks on which recording can be performed at a high density, and the like. As the semiconductors usable for such light-emitting elements, Group II–VI compound semiconductors such as ZnSe and Group III–V compound semiconductors such as SiC and GaN are known and have been researched vigorously. Recently, a blue-light-emitting diode was realized by using compound semiconductors such as GaN and $In_xGa_{1-x}N$ (where $0<x<1$, hereinafter, simply referred to as "InGaN"). Thus, light-emitting elements using gallium nitride group compound semiconductors have recently been the object of particular attention (see Japanese Laid-Open Publication No. 7-162038).

Hereinafter, a conventional gallium nitride group compound semiconductor light-emitting element will be described with reference to FIG. 19. This light-emitting element includes a multi-layer structure including: GaN buffer layer 101; an n-type $Al_xGa_{1-x}N$ (where $0<x<1$, hereinafter, simply referred to as "AlGaN") cladding layer 102; an InGaN active layer 103; a p-type AlGaN cladding layer 104; and a p-type GaN contact layer 105, these layers having been sequentially stacked in this order on a sapphire substrate (made of single crystalline $Al_2O_3$) 100. A p-side electrode (Au electrode) 107 is formed on the p-type GaN contact layer 105. An n-side electrode 108 (Al electrode) is formed on an exposed part of the n-type AlGaN cladding layer 102.

Hereinafter, a method for producing gallium nitride group compound semiconductor to be used for a conventional light-emitting element will be described with reference to FIGS. 20(a) to 20(d).

Gallium nitride group compound semiconductors are generally formed by a metalorganic vapor phase epitaxy (MOVPE) method or a molecular beam epitaxy (MBE) method. Herein, an exemplary method for producing gallium nitride group compound semiconductor using the MOVPE method will be described.

First, a sapphire substrate (made of single crystalline $A_2O_3$) 121 such as that shown in FIG. 20(a) is placed in the reactor of an MOVPE apparatus (not shown). Then, an organic metal such as trimethylgallium (TMG) and ammonium ($NH_3$) are supplied onto the substrate 121 at a temperature of about 600° C. while using hydrogen as a carrier gas, thereby depositing a polycrystalline GaN layer 122a on the substrate 121.

Next, a single crystalline GaN layer is formed on the polycrystalline GaN layer 122a. FIG. 2(b) illustrates a growth sequence of a single crystalline GaN layer. Hereinafter, this process step will be described in more detail.

After the supply of TMG as the material of Ga is suspended and the temperature of the substrate 121 has been raised to about 1000° C., TMG is supplied again onto the substrate. As a result, nuclei 122b of GaN single crystals showing a high degree of alignment along the crystal axes are formed as shown in FIG. 20(b). The grain size of the nuclei 122b of the GaN single crystals which are formed at such a temperature (of about 1000° C.) is in the range from about several $\mu$m to about several hundred $\mu$m.

Next, when TMG and $NH_3$ are continuously supplied while maintaining the temperature of the substrate 121 at about 1000° C., the nuclei 122b of the GaN single crystals grow principally in a two-dimensional manner, as shown in FIG. 20(c). As a result, the nuclei 122b come into contact with each other, thereby forming a single crystalline GaN layer 122c as shown in FIG. 20(d). The polycrystalline GaN layer 122a and the single crystalline GaN layer 122c form a GaN buffer layer 122.

Subsequently, other gallium nitride group compound semiconductor layers (not shown) are successively grown on the GaN buffer layer 122 by the MOVPE method.

In the above-described growth method, the single crystalline GaN layer 122c is formed by a single-stage crystal growth at about 1000° C.

Next, a method for fabricating the light-emitting element shown in FIG. 19 will be described with reference to FIG. 21.

First, as shown in FIG. 21, a polycrystalline GaN layer is deposited on a sapphire substrate 100 at about 600° C. and then a single crystalline GaN layer is grown at about 1000° C. by the above-described method, thereby forming the GaN buffer layer 101.

Thereafter, a multi-layer structure of gallium nitride group compound semiconductors 109 is grown on the GaN buffer layer 101. More specifically, an n-type AlGaN cladding layer 102 is grown at about 1000° C. by using TMA (trimethylaluminum), TMG (trimethylgallium), $SiH_4$ (monosilane) and ammonium. Next, by lowering the substrate temperature to about 700° C., an InGaN active layer 103 is grown by using TMI (trimethylindlium), TMG and $NH_3$. Then, by raising the substrate temperature to about 1000° C. again, a p-type AlGaN cladding layer 104 is grown by using TMA, TMG, $Cp_2Mg$ (cyclopentadienylmagnesium) and $NH_3$. Furthermore, a p-type GaN contact layer 105 is grown by using TMG, $Cp_2Mg$ and $NH_4$.

Next, as shown in FIG. 19, the InGaN active layer 103, the p-type AlGaN cladding layer 104 and the p-type GaN contact layer 105 are partially dry etched by using plasma or the like until a part of the n-type AlGaN cladding layer 102 is exposed.

Subsequently, a p-side electrode (Au electrode) 107 is formed on the p-type GaN contact layer 105 and an n-side electrode (Al electrode) 108 is formed on the exposed part of the n-type AlGaN cladding layer 102.

In the prior art method in which a single crystalline GaN layer constituting the GaN buffer layer 101 is grown on the sapphire substrate by a single-stage crystal growth (at about 1000° C.), a single crystalline GaN layer of high quality cannot be formed. That is to say, all the properties of the single crystalline GaN layer including the electrical and optical properties thereof and the crystal structure thereof cannot be made satisfactory.

The reasons are as follows. In the above-described prior art method, the nuclei 122b of GaN single crystals are formed on the polycrystalline GaN layer 122a at a relatively high temperature (at about 1000° C.). Thus, as shown in FIG. 20(c), the orientations of the nuclei 122b of the GaN single crystals do not become uniform. Consequently, several regions respectively having different orientations adversely exist in the structure of the resulting single crystalline GaN layer 122c, as shown in FIG. 20(d).

Since the single crystalline GaN layer 122c has a plurality of regions respectively having different orientations, multiple defects exist in the interface between the single crystalline GaN layer 122c and another single crystalline semiconductor layer to be formed thereon. Since the non-radiative recombination of electrons and holes is caused in these defective regions, it is difficult to fabricate a light-emitting element having a high injection current density.

Moreover, in the prior art, a sapphire substrate used as a substrate for a nitride group compound semiconductor light-emitting element has insulating properties, it has been necessary to perform the process step of partially etching the n-type AlGaN cladding layer 102, the InGaN active layer 103, the p-type AlGaN cladding layer 104 and the p-type contact layer 105 and forming the n-side electrode 108 on the partially exposed n-type AlGaN cladding layer 102 as shown in FIG. 19.

In view of the above-described circumstances, the present invention has been devised for the purposes of (1) proving a method for producing gallium nitride group compound semiconductor exhibiting excellent electrical and optical properties and crystal structure, and (2) providing a gallium nitride group compound semiconductor light-emitting element, in which it is no longer necessary to perform the process step of partially etching a semiconductor multi-layer structure for forming an n-side electrode and which has a small operating voltage.

DISCLOSURE OF INVENTION

The method for producing gallium nitride group compound semiconductor of the present invention includes the steps of: forming a polycrystalline nitride layer in a first temperature range on a substrate; forming a nucleus layer of gallium nitride single crystals in a second temperature range on the poly-crystalline nitride layer; growing the nucleus layer of gallium nitride single crystals in a third temperature range such that resulting crystals of the nucleus layer of gallium nitride single crystals come into contact with each other in a direction parallel to a surface of the substrate; and growing the nucleus layer of gallium nitride single crystals in a fourth temperature range in a direction vertical to the surface of the substrate, whereby the above-described objective is accomplished.

In one embodiment, the second, third and fourth temperature ranges are higher than the first temperature range.

In one embodiment, the second temperature range is equal to or lower than 1000° C.

In one another embodiment, the fourth temperature range is higher than the third temperature range and the third temperature range is higher than the second temperature range.

In one embodiment, the substrate is made of sapphire.

In one embodiment, the polycrlstalline nitride layer contains aluminum nitride and is formed by an ECR-CVD method or an ECR sputtering method.

In one embodiment, the polycrystalline nitride layer contains $Al_xGa_{1-x}N$ (where 0<x<1) and is formed by an MOVPE method.

The method for fabricating a gallium nitride group compound semiconductor device of the present invention includes the steps of: forming an aluminum nitride layer having a conductivity on a surface of a silicon carbide substrate; and forming a multi-layer structure of gallium nitride group compound semiconductors on the aluminum nitride layer, whereby the above-described objective is accomplished.

In one embodiment, the surface of the silicon carbide substrate is inclined from a (0001) plane of the silicon carbide substrate toward a direction [11-20] at a first angle.

In one embodiment, the first angle is about 1° to about 18°.

In one embodiment, the first angle is about 5° to about 12°.

In one embodiment, the step of forming the aluminum nitride layer is performed at a temperature of about 800° C. to about 1200° C.

In one embodiment, the aluminum nitride layer is composed of single crystals.

In one embodiment, the method further includes a step of forming a single crystalline gallium nitride layer on the aluminum nitride layer.

In one embodiment, the aluminum nitride layer is doped with silicon as an impurity.

The gallium nitride group compound semiconductor light-emitting element of the present invention includes: a silicon carbide substrate; an aluminum nitride layer having a conductivity which has been formed on a surface of the silicon carbide substrate; and a multi-layer structure of gallium nitride group compound semiconductors provided on the aluminum nitride layer, whereby the above-described objective is accomplished.

In one embodiment, the surface of the silicon carbide substrate is inclined from a (0001) plane of the silicon carbide substrate toward a direction [11-20] at a first angle.

In one embodiment, the first angle is about 1° to about 18°.

In one embodiment, the first angle is about 5° to about 12°.

In one embodiment, the gallium nitride group compound semiconductor light-emitting element further includes an electrode formed on the multi-layer structure, an $In_xGa_{1-x}N$ (where 0<x<1) layer having an opposite conductivity type to the conductivity type of the substrate is provided between the multi-layer structure and the electrode.

In one embodiment, the electrode is made of platinum.

The method of the present invention for fabricating a gallium nitride group compound semiconductor lightemitting element including a multi-layer structure of gallium nitride group compound semiconductors having an $Al_xGa_y In_zN$ (where $0 \leq x<1$, $0 \leq y<1$, $0<z \leq 1$ and x+y+z=1) active layer formed on a substrate, includes the steps of: forming the active layer in a first temperature range; forming a GaN cap layer for suppressing an evaporation of In on the active layer; and performing a heat treatment on the active layer in a second temperature range higher than the first temperature range, whereby the above-described objective is accomplished.

In one embodiment, the step of forming the GaN cap layer is performed in the first temperature range.

In one embodiment, the step of forming the GaN cap layer is performed by raising a temperature from the first temperature range to the second temperature range.

In one embodiment, a thickness of the GaN cap layer is in the range from about 1 nm to about 10 nm, both inclusive.

In one embodiment, the first temperature range is from about 500° C. to about 800° C. and the second temperature range is equal to or higher than 1000° C.

The gallium nitride group compound semiconductor light-emitting element of the present invention includes a multi-layer structure of gallium nitride group compound semiconductors having an $Al_xGa_yIn_zN$ (where $0 \leq x < 1$, $0 \leq y < 1$, $0 < z \leq 1$ and $x+y+z=1$) active layer formed on a substrate. A GaN cap layer for suppressing an evaporation of In is formed on the active layer, whereby the above-described objective is accomplished.

In one embodiment, a thickness of the GaN cap layer is in the range from about 1 nm to about 10 nm, both inclusive.

The gallium nitride group compound semiconductor light-emitting element of the present invention including a multi-layer structure of gallium nitride group compound semiconductors formed on a substrate. The multi-layer structure includes an active layer and a pair of a p-type cladding layer and an n-type cladding layer, the pair of cladding layers sandwiching the active layer, and carbon is used as a p-type dopant for the p-type cladding layer, whereby the above-described objective is accomplished.

In one embodiment, a p-type guide layer is provided between the active layer and the p-type cladding layer, and carbon is used as a p-type dopant for the p-type guide layer.

BEST MODE FOR CARRYING OUT THE INVENTION

Hereinafter, the embodiments of the present invention will be described in detail. It should be noted that the "gallium nitride group compound semiconductor" is herein assumed to include: gallium nitride (GaN) semiconductors in which Ga has partially been replaced by another Group III element, such as $In_sGa_{1-s}N$ (where $0 \leq s < 1$) and $Al_tGa_{1-t}N$ (where $0 \leq t < 1$); GaN semiconductors in which each constituent atom has partially been replaced by a dopant atom or the like; and GaN semiconductors to which other impurities have been added. $In_sGa_{1-s}N$ and $Al_tGa_{1-t}N$ will also be simply referred to as "InGaN" and "AlGaN", respectively.

Moreover, it is also assumed that: "semiconductor light-emitting elements" herein include light-emitting diodes and semiconductor laser devices.

EXAMPLE 1

Figure 1:
FIG. 1(a) to 1(d) are views illustrating the process steps for producing the gallium nitride group compound semiconductor of the present invention.
Figure 1:
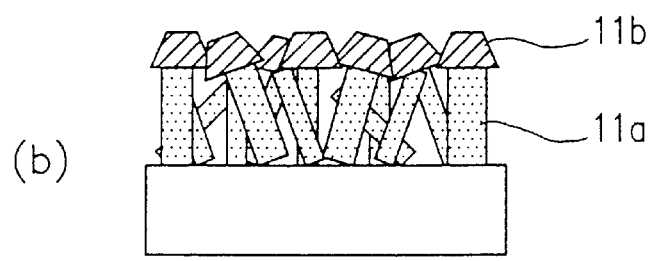
Figure 1:
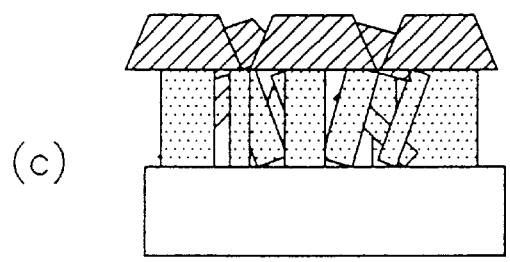
Figure 1:
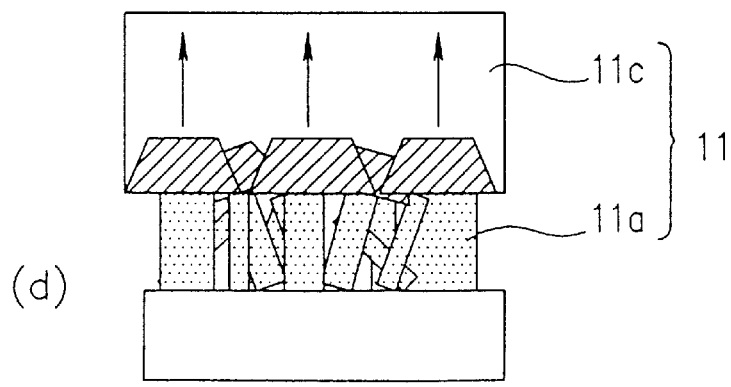
Figure 2:
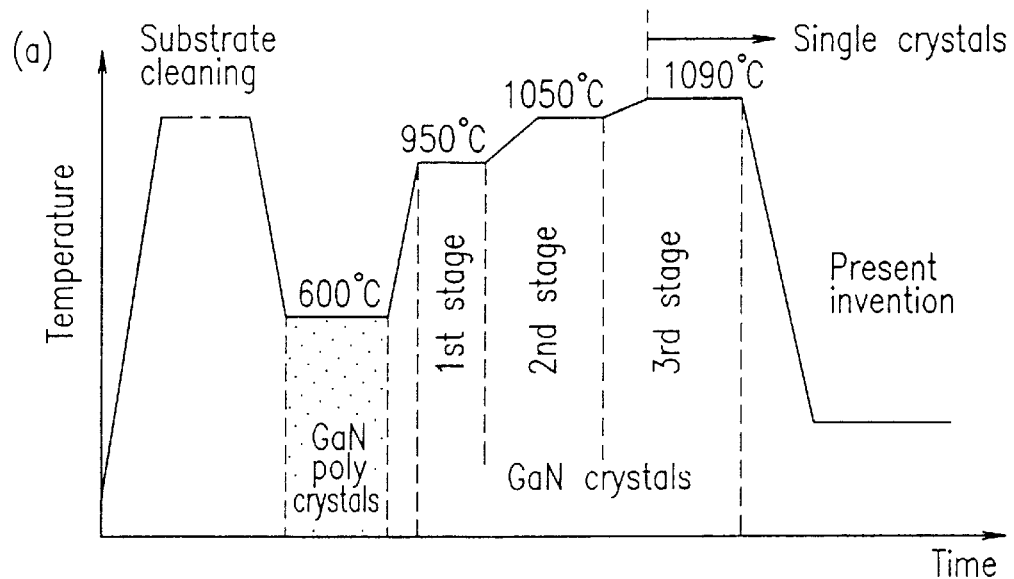
FIG. 2(a) is a graph illustrating the sequence of a crystal growth in accordance with the present invention.
FIG. 2(b) is a graph illustrating the sequence of a crystal growth in accordance with the prior art.
Figure 2:
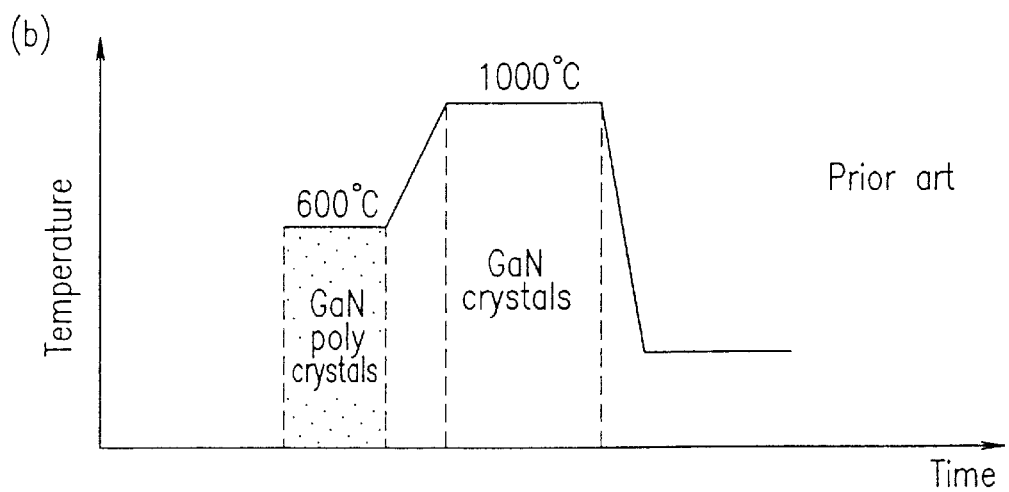

A method for producing gallium nitride group compound semiconductor in accordance with the present invention will be described with reference to FIG. 1 and FIG. 2. In particular, a method for forming a single crystalline GaN layer on a sapphire substrate will be described. It is noted that, in this embodiment, a metalorganic vapor phase epitaxy (MOVPE) method is utilized for forming crystalline layers.

FIG. 1(a) to 1(d) are cross-sectional views illustrating the method for growing the single crystalline GaN layer of the present invention. FIG. 2(a) illustrates the growth sequence of the single crystalline GaN layer.

First, in order to perform a crystal growth, a sapphire (single crystalline $Al_2O_3$) C-plane substrate 10 is disposed on a susceptor in a reactor of an MOVPE apparatus (not shown), an evacuation is performed, and then the substrate is heated at about 1050° C. for about 15 minutes within hydrogen environment at about 70 Torr, thereby subjecting the surface of the substrate 10 to a cleaning treatment.

Next, as shown in FIG. 2(a), after the substrate has been cooled down to about 600° C., trimethylgallium (TMG), ammonium and carrier hydrogen are supplied at the respective flow rates of about 20 µmol/min., about 2.5 L/min., and about 2 L/min., thereby depositing a GaN layer in a polycrystalline state (i.e., a polycrystalline GaN layer) 11a to be 50 nm thick, as shown in FIG. 1(a). The temperature range defined for depositing the polycrystalline GaN layer 11a (i.e., a first temperature range) is preferably from about 500° C. to about 600° C.

Next, in order to form a satisfactory single crystalline GaN layer on the polycrystalline GaN layer 11a, the following three-stage crystal growth process is performed.

The first stage is a process step for forming a nucleus layer of GaN single crystals. First, only the supply of TMG is suspended and the substrate temperature is raised to about 950° C. Thereafter, TMG is supplied again at a flow rate of about 20 µmol/min., thereby depositing the nucleus layer 11b of the GaN single crystals as shown in FIG. 1(b). The time required for forming the nucleus layer 11b of GaN single crystals at about 950° C. is about 3 minutes. The temperature range defined for forming the nucleus layer 11b of GaN single crystals (i.e., a second temperature range) is preferably from about 700° C. to about 1000° C., both inclusive. The reason is as follows. If it is lower than 700° C., ammonium cannot be decomposed sufficiently. Conversely, if it is higher than 1000° C., the single crystallization of the polycrystalline GaN layer 11a unintentionally proceeds to make the surface of the polycrystalline GaN layer 11a uneven. Consequently, a nucleus layer 11b of GaN single crystals having satisfactory surface flatness cannot be grown on the polycrystalline GaN layer 11a. This point will be described in detail later. The crystal grain size of the nucleus layer 11b of GaN single crystals to be formed in accordance with the present invention is in the range from about several µm to about several hundred µm.

Next, a second-stage crystal growth is performed. In this process step, TMG is continuously supplied in succession to the first stage, the substrate temperature is raised from about 950° C. to about 1050° C. (i.e., a third temperature range) (time for the temperature rise: about 2 minutes) and the latter temperature is maintained for about 3 minutes.

Next, a third-stage crystal growth is performed. In this process step, TMG is continuously supplied in succession to the second stage, the substrate temperature is raised from about 1050° C. to about 1090° C. (i.e., a fourth temperature range) (time for the temperature rise: about 2 minutes) and the latter temperature is maintained for about 60 minutes.

By performing the second- and the third-stage process steps, the nucleus layer 11b of GaN single crystals formed in the first stage is grown to be a single crystalline GaN layer 11c as shown in FIG. 1(d). The thickness of the single crystalline GaN layer 11c is about 0.1 µm to about 5 µm, both inclusive. In order to realize satisfactory crystallinity, the growth temperatures (about 1050° C. and about 1090° C., respectively) of the second and third stages are preferably set in the range from about 1000° C. to about 1200° C., both inclusive.

Finally, only the supply of TMG is suspended and the substrate is cooled down to room temperature within mixture environment of ammonium and hydrogen.

The single crystalline GaN layer 11c is formed on the polycrystalline GaN layer 11a in the above-described manner. The polycrystalline GaN layer 11a and the single crystalline GaN layer 11c form a GaN buffer layer 11. A multi-layer structure of gallium nitride group compound semiconductors for emitting light is deposited on the GaN buffer layer 11. In this embodiment, the polycrystalline layer for forming the buffer layer 11 is made of GaN. Alternatively, $Al_xGa_{1-x}N$ (where $0<x\leq1$) may also be used instead of GaN.

The important feature of the present invention lies in the multiple-stage (e.g., 3-stage) crystal growth for forming the single crystalline GaN layer 11c. Such a multiple-stage crystal growth results in a single crystalline GaN layer 11c of high quality.

Hereinafter, the mechanism for forming the single crystalline GaN layer 11c will be described in more detail.

According to the present invention, in the first stage, the nucleus layer 11b of GaN single crystals is deposited on the polycrystalline GaN layer 11a at a relatively low temperature (i.e., a temperature of about 950° C., which is lower than 1000° C.). The use of such a low deposition temperature reduces the size of each nucleus in the nucleus layer 11b of GaN single crystals. As a result, the nuclei can be densely formed over the entire surface of the substrate. Thus, the surface flatness of the nucleus layer 11b of GaN single crystals can be enhanced. Moreover, since the deposition temperature is low, the crystal nuclei in the nucleus layer 11b of GaN single crystals have a low degree of alignment and are oriented in multiple directions.

In the second stage (about 1050° C.), the nuclei horizontally oriented to the surface of the substrate 10 among the nuclei in the nucleus layer 11b of GaN single crystals primarily grow two-dimensionally, particularly in the direction parallel to the surface of the substrate 10, as shown in FIG. 1(c). As a result, adjacent nuclei having a low degree of alignment are also caused to be oriented to the same direction and these nuclei come into contact with each other two-dimensionally in the direction parallel to the surface of the substrate 10. Consequently, a satisfactorily aligned nucleus layer of GaN single crystals is formed. That is to say, the crystal nuclei in the nucleus layer 11b of GaN single crystals which have been oriented in random directions grow so as to be aligned with the same direction parallel to the surface of the substrate 10.

In the third stage, when the crystal growth is carried on at a higher temperature (about 1090° C.), the nucleus layer 11c of GaN single crystals, in which the crystals have been precisely aligned in the direction parallel to the surface of the substrate 10, begin to grow in turn in the direction vertical to the surface of the substrate 10, as shown in FIG. 1(d). That is to say, a single crystalline GaN layer 11c which has been highly aligned along the C-axis in accordance with the orientation of the surface of the substrate 10 is formed in a wide area on the substrate 10. The single crystalline GaN layer 11c thus formed has a high surface flatness.

In order to evaluate the crystallinity of the single crystalline GaN layer 11c formed by this embodiment, the full widths at half maximum at the peaks of diffraction were measured based on a double crystal X-ray diffraction. The crystals in the single crystalline GaN layer 11c have a full width at half maximum of three minutes. On the other hand, the crystals in a single crystalline GaN layer formed by a conventional single-stage crystal growth method (about 1000° C.) have a long full width at half maximum of five minutes. As can be seen from these results, a satisfactory single crystalline GaN layer having excellent crystallinity can be obtained in this embodiment.

Figure 3:
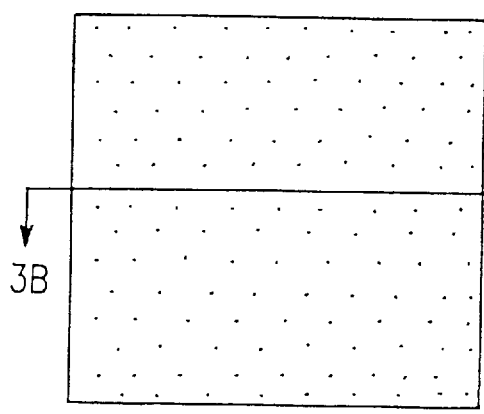
FIGS. 3(a) and 3(b) are diagrams showing the surface state of a single crystalline GaN layer which has been grown by the production method of the present invention.
FIGS. 3(c) and 3(d) are diagrams showing the surface state of a single crystalline GaN layer which has been grown by a conventional production method.
Figure 3:
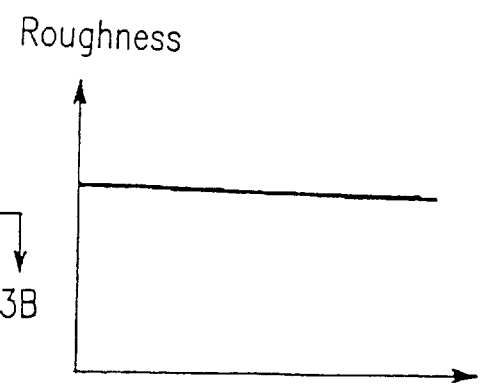
Figure 3:
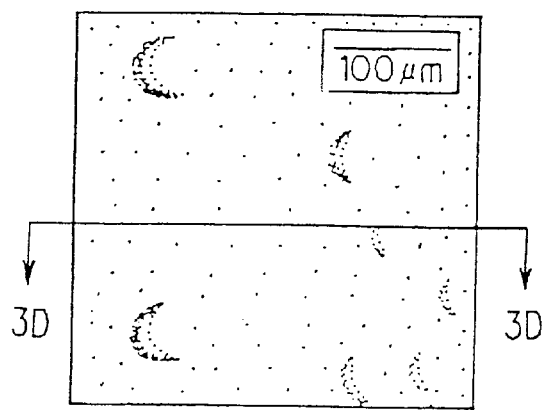
Figure 3:
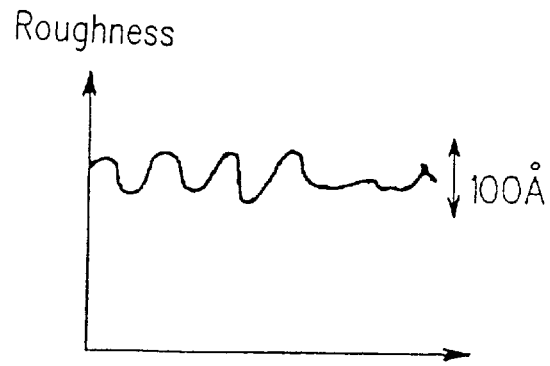

Furthermore, the photograph of the surface of the single crystalline GaN layer 11c formed by this embodiment was taken using an optical microscope, thereby analyzing the flatness thereof. The results thereof are shown in FIGS. 3(a) and 3(b). FIGS. 3(c) and 3(d) illustrate schematically the surface state of a single crystalline GaN layer obtained by prior art. FIG. 3(a) and 3(c) are plan views of the single crystalline GaN layers. FIGS. 3(b) and 3(d) show the states of the profiles taken along the lines 3B—3B and 3D—3D of FIGS. 3(a) and 3(c), respectively.

In accordance with the prior art, some unevenness is observed in a range having a distance of about 300 μm (substantially equal to the size of a light-emitting element) on the surface of the single crystalline GaN layer (FIG. 3(c)). In addition, as can be seen from FIG. 3(d), the surface roughness of the single crystalline GaN layer is approximately 100 Å. Since the single crystalline GaN layer has a poor surface flatness, it is difficult to deposit a multi-layer structure of gallium nitride group compound semiconductors having a sharp interface on such a layer.

On the other hand, in this embodiment, a single crystalline GaN layer having a uniform and flat surface can be obtained as shown in FIG. 3(a). In addition, as can be seen from FIG. 3(b), no surface unevenness can be detected from the single crystalline GaN layer 11c obtained by this embodiment. Since the analysis limit of the optical microscope used for the measurement was 50 Å, the surface roughness of the single crystalline GaN layer 11c obtained by this embodiment was presumed to be 50 Å or less. In this embodiment, since the surface of the single crystalline GaN layer 11c exhibits excellent flatness, it is possible to form a multi-layer structure of gallium nitride group compound semiconductors having excellent crystallinity and a sharp interface on such a layer.

Figure 4:
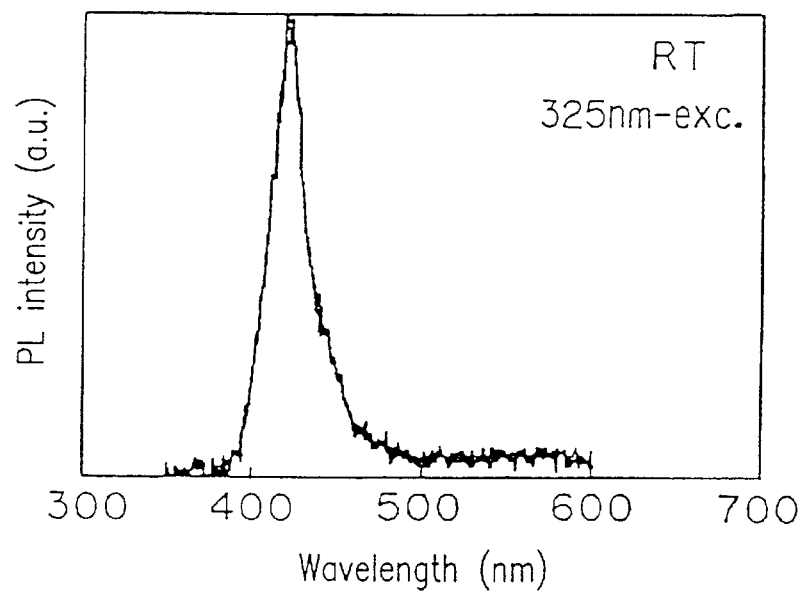
FIG. 4(a) is a graph illustrating the photoluminescence at room temperature of an InGaN layer which has been grown by the production method of the present invention.
FIG. 4(b) is a graph illustrating the photoluminescence at room temperature of an InGaN layer which has been grown by a conventional production method.
Figure 4:
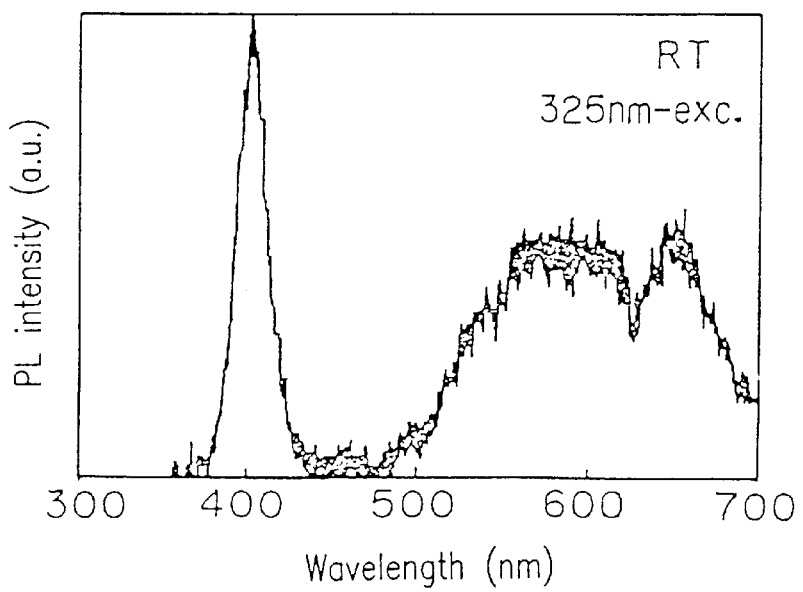

A multi-layer structure of gallium nitride group compound semiconductors including an InGaN layer was deposited on the single crystalline GaN layer 11c obtained in this embodiment by the MOVPE method, and the photoluminescence thereof was observed at room temperature. The observation results are shown in FIG. 4(a). As can be seen from FIG. 4(a), only a band-end light emission appears in the vicinity of 410 nm, which proves that a multi-layer structure of gallium nitride group compound semiconductors of high quality has been formed.

FIG. 4(b) illustrates the observation results of photoluminescence at room temperature when a single crystalline GaN layer was formed in accordance with the prior art and a multi-layer structure of gallium nitride group compound semiconductors including an InGaN layer was deposited thereon. As can be seen from this figure, not only the band-end light emission, but also another light emission from a deep level which is presumed to result from defects are observed in the vicinity of 410 nm and 550 nm, respectively. The latter light emission is caused by the degradation in quality of the InGaN layer.

EXAMPLE 2

Figure 5:
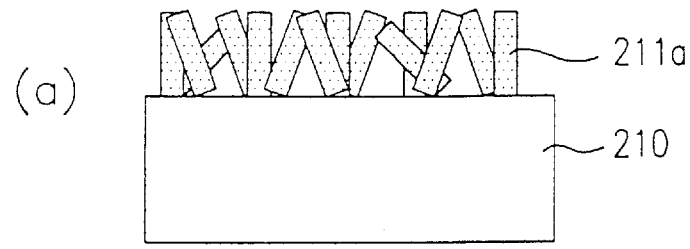
FIGS. 5(a) to 5(d) are views illustrating the process steps for producing the gallium nitride group compound semiconductor of the present invention.
Figure 5:
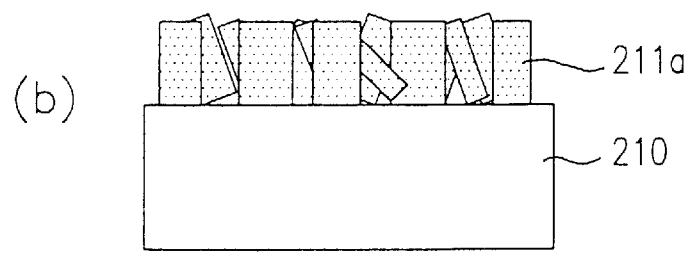
Figure 5:
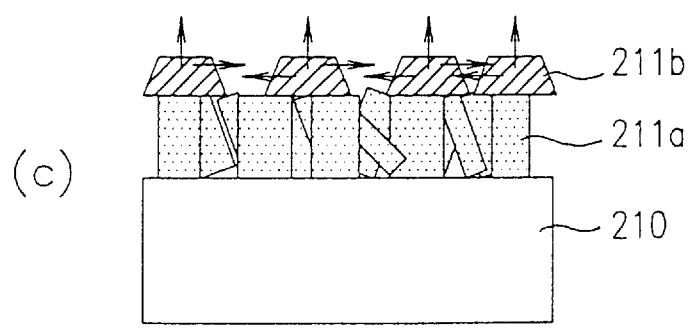
Figure 5:
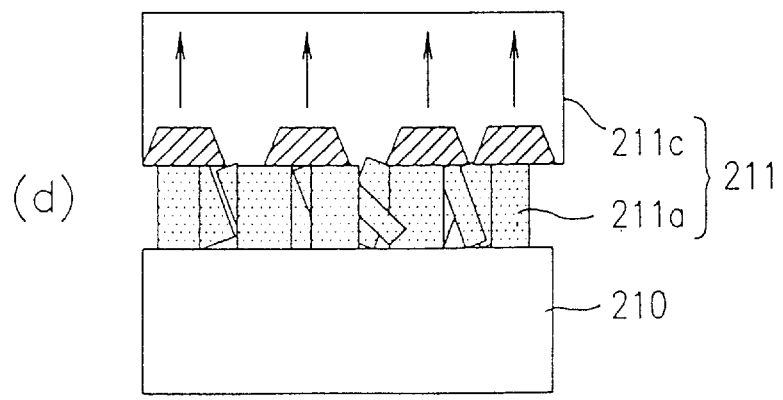

A method for forming a single crystalline GaN layer on a SiC substrate 210 will be described as a second embodiment of the present invention with reference to FIG. 5 and FIG. 6.

In this embodiment, silicon carbide (SiC) having a 6H structure is used as a material for the substrate 210. The SiC substrate 210 is doped with nitrogen and has an n-conductivity type. The SiC substrate 210 is inclined about 3.5 degrees away from the (0001) plane toward the [11-20] direction. In this specification, such a substrate will be called an "inclined substrate" or a "mis-oriented substrate".

Moreover, in this embodiment, an electron cyclotron resonance chemical vapor deposition (ECR-CVD) method or an electron cyclotron resonance sputtering method (ECR sputtering method) is used for depositing a polycrystalline layer in order to form a single crystalline GaN layer. It is noted that AlN is used as a material for forming the polycrystalline layer.

FIGS. 5(a) to 5(d) are cross-sectional views illustrating the method for growing the single crystalline GaN layer of the present invention. FIG. 6 illustrates the growth sequence of the single crystalline GaN layer.

First, in order to perform a crystal growth, the silicon carbide substrate 210 is disposed on a susceptor in a reactor of an ECR-CVD apparatus or an ECR sputtering apparatus (neither is shown), an evacuation is performed, and then the substrate is heated at about 1050° C. for about 15 minutes within hydrogen environment at about 70 Torr, thereby subjecting the surface of the substrate 210 to a cleaning treatment.

Figure 6:
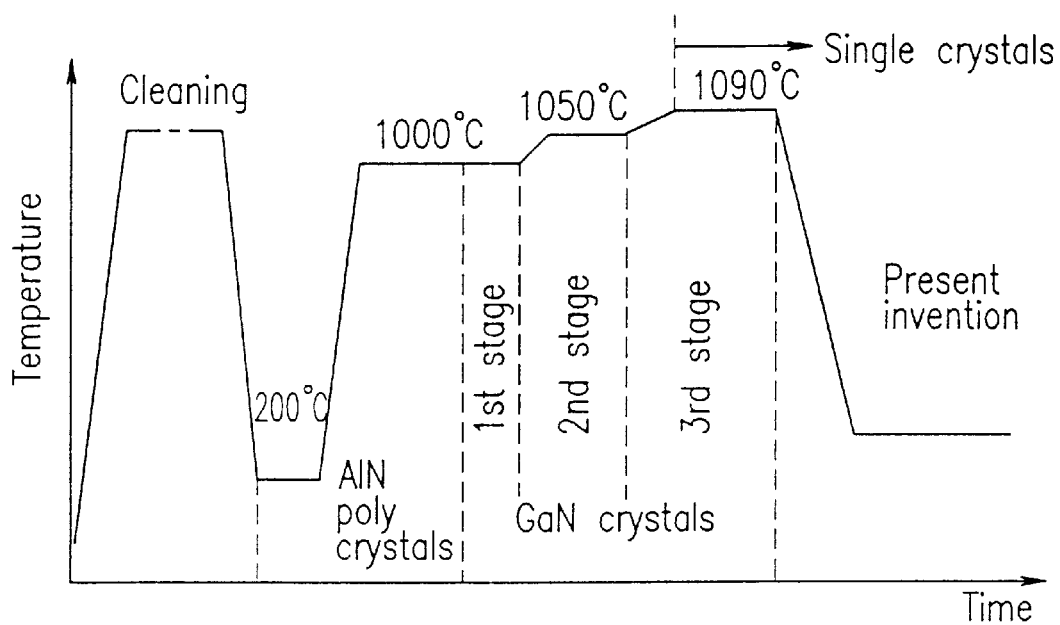
FIG. 6 is a graph illustrating the sequence of a crystal growth in accordance with the present invention.

Next, as shown in FIG. 6, after the substrate 210 is cooled down to about 200° C., a solid of Al (purity: 6N) and nitrogen gas are supplied into the reactor of the ECR-CVD apparatus or the ECR sputtering apparatus. The pressure inside the reactor of the ECR-CVD apparatus or the ECR sputtering apparatus is about $1 \times 10^{-3}$ Torr. Next, microwaves of about 2.45 GHz and about 500 W are applied thereto, thereby depositing an AlN layer in a polycrystalline state (a polycrystalline AlN layer) 211a to be about 50 nm thick as shown in FIG. 5(a). The grain size of the crystals in the polycrystalline AlN layer 211a thus obtained is in the order of several Å to several thousand Å.

Next, the substrate 210 on which the polycrystalline AlN layer 211a has been deposited is disposed within a reactor of an MOVPE apparatus and subjected to a heat treatment at about 1000° C. for about 10 minutes within mixture environment of ammonium and hydrogen. In order to increase the conductivity of the polycrystalline GaN layer 211a, the heat treatment temperature is preferably set in the range from about 800° C. to about 1200° C., both inclusive. The polycrystalline AlN layer 211a is more satisfactorily aligned in the direction of the C-axis by this treatment, as shown in FIG. 5(b).

Next, in order to form a satisfactory single crystalline GaN layer on the polycrystalline AlN layer 211a, substantially the same process steps as those of the three-stage crystal growth process described in the first embodiment are performed. The details thereof are as follows.

In the first stage, while maintaining the substrate temperature at about 1000° C., TMG and ammonium are supplied by using hydrogen gas as a carrier gas, thereby forming a nucleus layer 211b of GaN single crystals highly aligned in the direction of the C-axis on the polycrystalline AlN layer 211a, as shown in FIG. 5(c). The time required for forming the nucleus layer 211b of GaN single crystals is about 2 minutes.

In the second stage, the substrate temperature is raised to about 1050° C., thereby growing the polycrystalline GaN layer 211a. In the third stage, the substrate temperature is further raised to about 1090° C., thereby further growing the polycrystalline GaN layer 211a. As a result, a single crystalline GaN layer 211c (thickness: about 0.1 μm to about 5 μm) is formed as shown in FIG. 5(d). The other crystal growth conditions used in the second and third stages for the MOVPE are similar to those of the first embodiment.

The polycrystalline AlN layer 211a and the single crystalline GaN layer 211c form a buffer layer 211. A multi-layer structure of gallium nitride group compound semiconductors for emitting light is deposited on the buffer layer 211.

The deposition of the polycrystalline AlN layer 211a in accordance with the ECR-CVD method or the ECR sputtering method has the following advantages. In accordance with the ECR-CVD method or the ECR sputtering method, the polycrystalline AlN layer 211a may be deposited at a low temperature of about 200° C. On the other hand, in accordance with an MOVPE method, since ammonium or the material of nitrogen is not decomposed at such a low temperature of about 200° C., the polycrystalline AlN layer 211a cannot be deposited.

In this embodiment, since the polycrystalline AlN layer 211a is formed at a temperature of about 200° C. in accordance with the ECR-CVD method or the ECR sputtering method, the crystal grain size of the polycrystalline AlN layer 211a is small (i.e., in the range from several Å to several thousand Å). By performing a heat treatment on the crystal grains having such a small size and improving the degree of alignment of the polycrystalline AlN layer 211a, highly aligned and highly dense nuclei of GaN single crystals can be formed on the polycrystalline AlN layer 211a. On the other hand, in the case of using a polycrystalline AlN layer which has been deposited at a temperature of about 600° C. in accordance with the MOVPE method, it becomes difficult to form highly aligned and highly dense nuclei of GaN single crystals on the polycrystalline AlN layer, as compared with the case of utilizing the ECR-CVD method or the ECR sputtering method. According to the present invention, so long as the temperature is in the range from about 150° C. to about 250° C., a polycrystalline AlN layer 211a satisfactorily acting as a polycrystalline layer can be deposited. In the foregoing description, silicon carbide is used as a material of the substrate. Alternatively, sapphire may also be used instead of silicon carbide.

In order to evaluate the crystallinity of the single crystalline GaN layer 211c formed by this embodiment, the full widths at half maximum at the peaks of diffraction were measured in accordance with the double crystal X-ray diffraction. The crystals in the single crystalline GaN layer 211c show a full width at half maximum of three minutes in accordance with the double crystal X-ray diffraction. As can be seen from this result, a single crystalline GaN layer 211c of high quality, the surface of which is highly flat, can be obtained in this embodiment.

Hereinafter, the reasons why a SiC inclined substrate is used as the substrate 210 will be described. In this embodiment, an n-type SiC substrate, which has been polished so as to be inclined about 3.5 degrees away from the (0001) plane toward the [11-20] direction, is used. Thus, in the case of depositing AlGaN mixed crystals, in particular, on the SiC substrate, the surface flatness of the AlGaN mixed crystals is improved. It is noted that similar effects can also be attained if an n-type SiC substrate, which has been polished so as to be inclined about 3.5 degrees away from the (0001) plane toward the [1-100] direction, is used.

Figure 7:
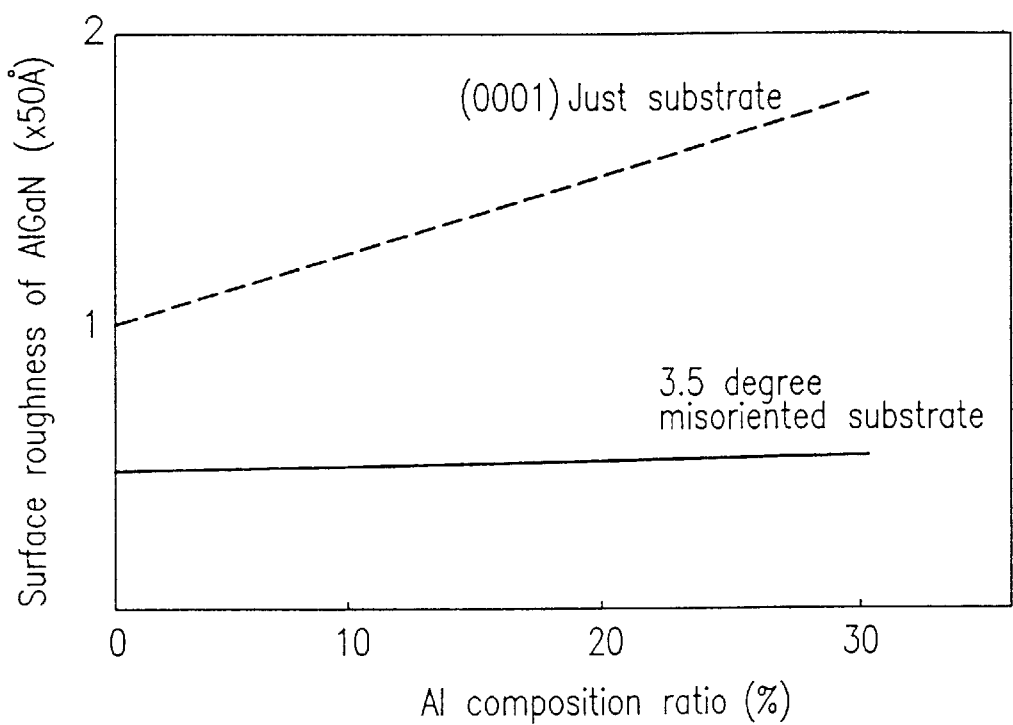
FIG. 7 is a graph illustrating the relationship between the surface roughness of an AlGaN layer and the composition of Al when a silicon carbide substrate is used.

FIG. 7 illustrates the relationship between the surface roughness of the AlGaN layer deposited on the SiC inclined substrate and the composition ratio of Al in AlGaN. The axis of the abscissas represents the composition ratio of Al and the axis of the ordinates represents the surface roughness of the AlGaN layer. In FIG. 7, the broken line indicates the case where a (0001) just substrate is used. In this specification, the "(0001) just substrate" refers to a substrate which is not inclined from the (0001) plane to any direction. On the other hand, the solid line in FIG. 7 indicates a case where a substrate inclined about 3.5 degrees away from the (0001) plane toward the [11-20] direction is used. In FIG. 7, the larger a value corresponding to an ordinate becomes, the larger the surface roughness of the AlGaN layer becomes and the less flat the surface thereof becomes. As can be seen from FIG. 7, in the case of using an inclined substrate, the surface flatness of the AlGaN layer does not become inferior even when the composition ratio of Al increases to reach about 30%.

Figure 8:
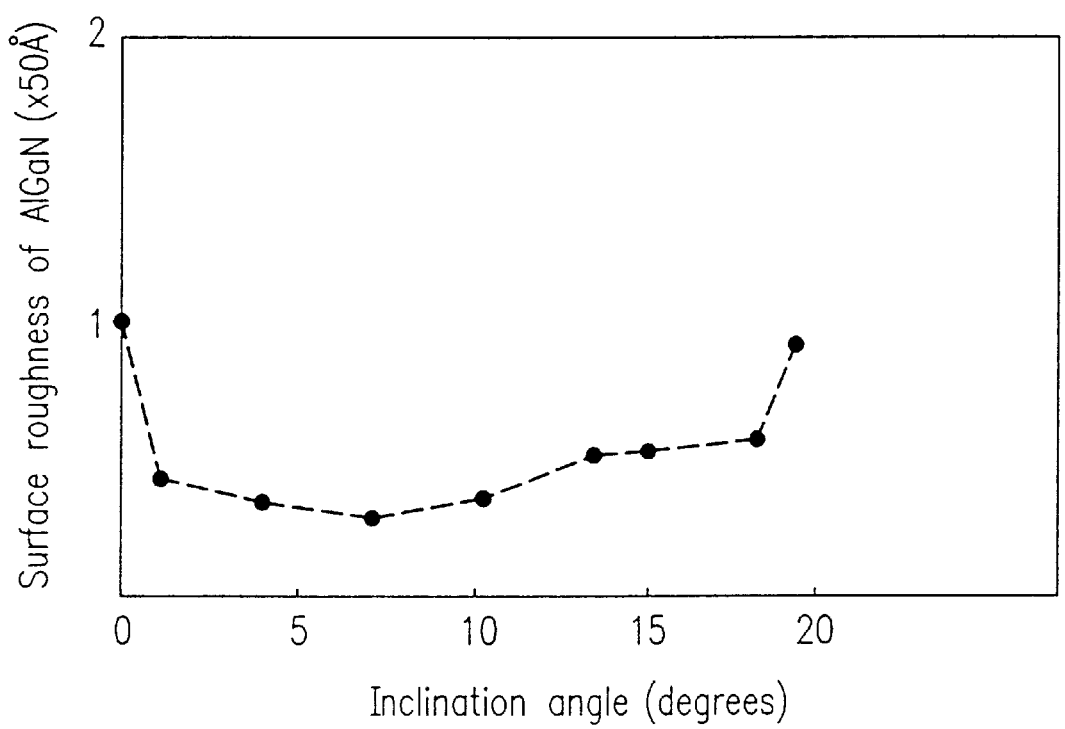
FIG. 8 is a graph illustrating the relationship between the inclination angle of a silicon carbide substrate and the surface roughness of the AlGaN layer.

FIG. 8 illustrates the relationship between the surface roughness of the AlGaN layer and the inclination angle of the substrate. The surface roughness of the AlGaN layer is represented on the axis of the ordinates. The inclination angle refers to an angle by which the substrate is inclined from the (0001) plane toward the [11-20] direction and is represented on the axis of the abscissas.

As shown in FIG. 8, the surface roughness of AlGaN is kept relatively small as the inclination angle become greater. As can be seen from FIG. 8, the surface flatness of the AlGaN layer is kept high when the inclination angle is in the range from about 1 degree to about 18 degrees.

In addition, when the inclination angle of the substrate is in the range from about 5 degrees to about 15 degrees, the ratio of a p-type dopant absorbed into AlGaN to be described later is also increased.

The present inventors have found that, in the case where a (0001) just substrate is used for forming a p-type AlGaN layer, the absorption ratio of Mg as a p-type dopant is decreased and the resistance of an element becomes higher as the composition ratio of Al is increased. However, in this embodiment, such a problem can be solved by using an inclined substrate.

Figure 9:
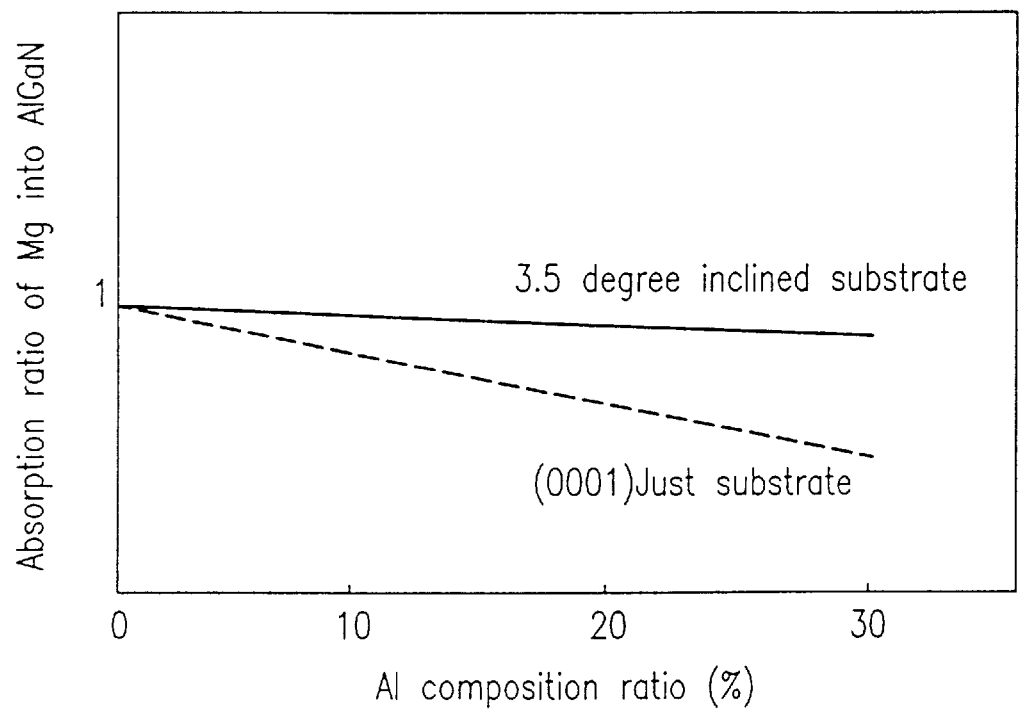
FIG. 9 is a graph illustrating the relationship between the ratio of Mg absorbed into the AlGaN layer and the composition of Al when a silicon carbide substrate is used.

FIG. 9 illustrates the relationship between the ratio of Mg as a dopant absorbed into the AlGaN layer and the Al composition ratio in AlGaN when an inclined silicon carbide substrate is used. In FIG. 9, the axis of the abscissas represents the Al composition ratio in AlGaN and the axis of the ordinates represents the absorption ratio of Mg into the AlGaN layer. As shown in FIG. 9, the absorption ratio of Mg into AlGaN in the case of using an inclined substrate is higher than the absorption ratio of Mg into AlGaN in the case of using a just substrate.

Furthermore, as can be seen from FIG. 9, as the Al composition ratio is increased, the absorption ratio of Mg in the case of using a just substrate is decreased, whereas the absorption ratio of Mg in the case of using an inclined substrate is substantially constant. This tendency is not limited to the case of using Mg as a dopant, but also appears in the case of using Zn, C, Ca or the like as a dopant.

As described above, in this embodiment, since the concentration of a p-type dopant in gallium nitride group semiconductor can be increased, the operating voltage of a light-emitting element can be reduced.

Though an inclined substrate is used in this embodiment, a (0001) just substrate may also be used instead. In such a case, by using an n-type AlN layer as a polycrystalline layer for forming the buffer layer, the resistance and the operating voltage of a light-emitting element can be reduced.

Another advantage to be attained by the use of an inclined substrate is the reduction of crystal defects in the vicinity of an InGaN active layer formed on the substrate.

Figure 10:
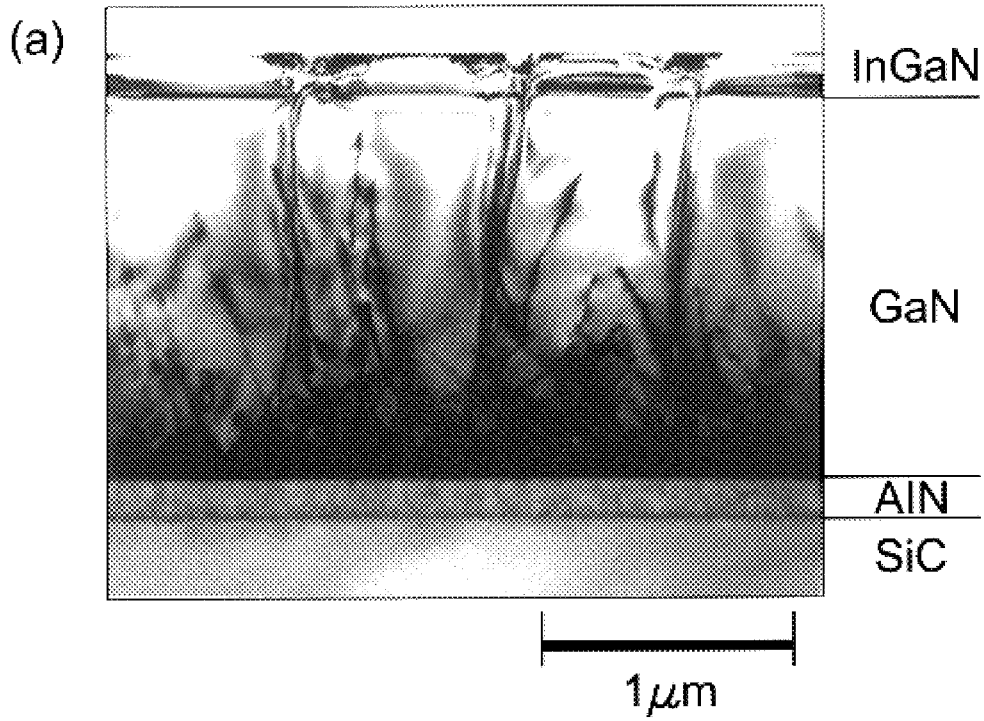
FIG. 10(a) is a TEv photograph showing the profile of an InGaN/GaN/AlN multi-layer structure formed on a (0001) just substrate of silicon carbide.
FIG. 10(b) is a TEM photograph showing the profile of an InGaN/GaN/AlN multi-layer structure formed on an inclined silicon carbide substrate.
Figure 10:
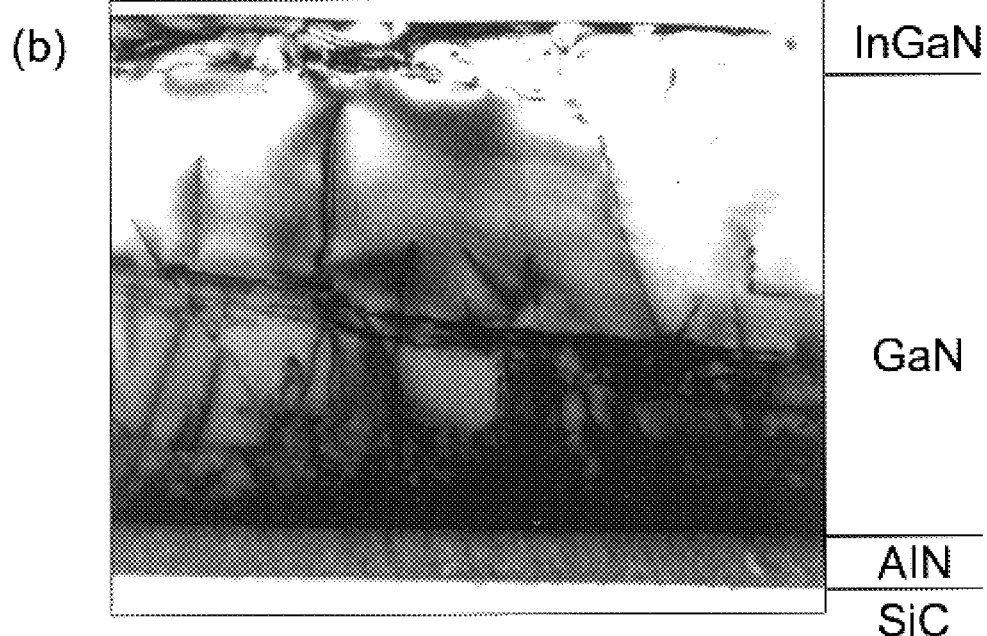

FIG. 10(a) is a TEM (transmission electron microscopy) photograph showing the profile of an InGaN/GaN/AlN multi-layer structure formed on a (0001) just substrate of silicon carbide, and FIG. 10(b) is a TEM photograph showing the profile of an InGaN/GaN/AlN multi-layer structure formed on a SiC substrate which is inclined about 3.5 degrees away from the (0001) plane toward the [11-20] direction.

As shown in FIG. 10(a), in the case of using a just substrate, the crystal defect portions (patterns like branches) exist in the GaN film in the direction substantially vertical to the surface of the substrate (or the C-axis direction) and extend so far as to reach the InGaN layer. On the other hand, as shown in FIG. 10(b), in the case of using an inclined substrate, the crystal defect portions exist in the GaN film so as to be bent to the direction vertical to the C-axis direction. Thus, the amount of defects in the vicinity of the InGaN layer is reduced. This is presumably because the lattice defects of the crystals are reduced by the step-like surface of the inclined substrate.

The method for producing gallium nitride group compound semiconductor as described in the first and second embodiments is not limited to the fabrication of a light-emitting element, but applicable to the fabrication of a light-receiving element.

EXAMPLE 3

Figure 11:
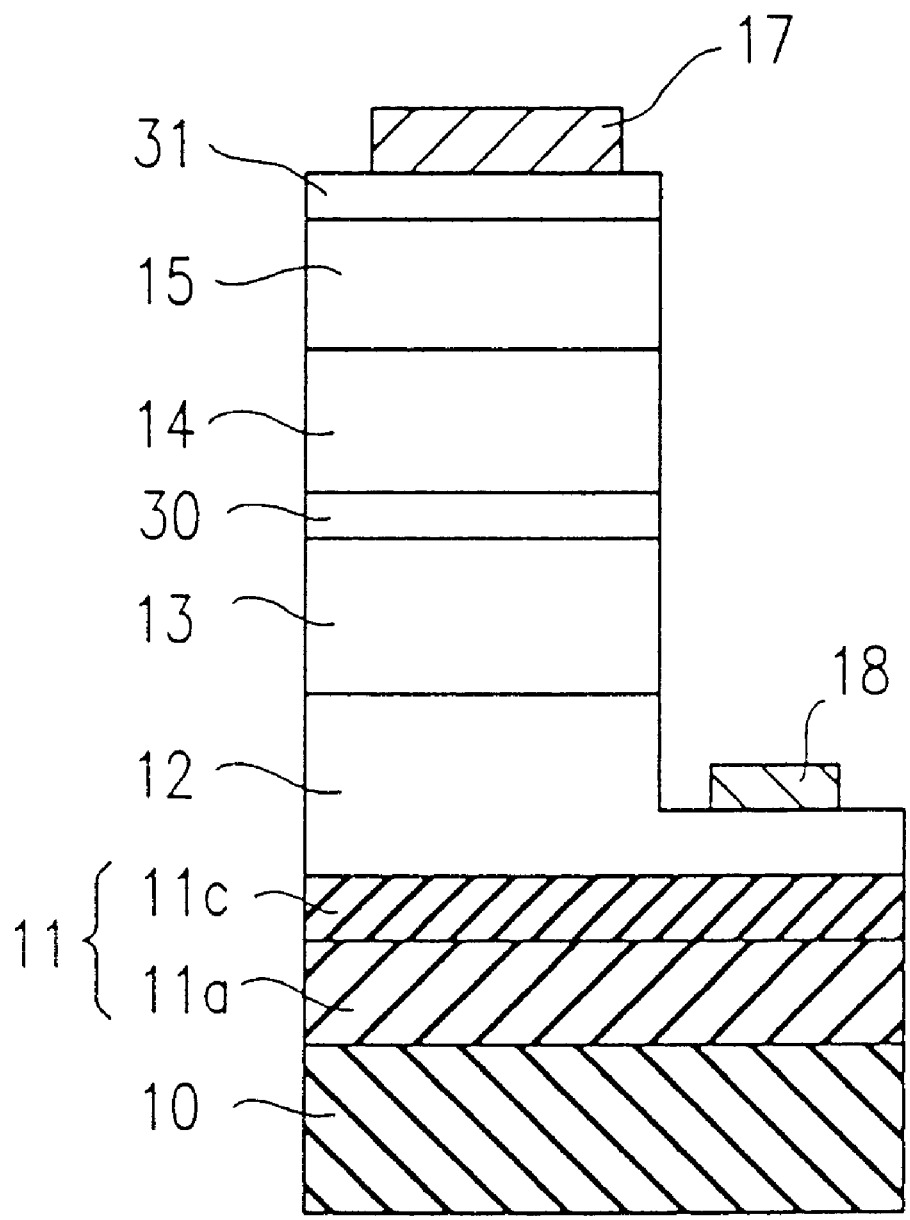
FIG. 11 is a cross-sectional view showing the structure of a light-emitting element using a sapphire substrate in accordance with the present invention.
Figure 12:
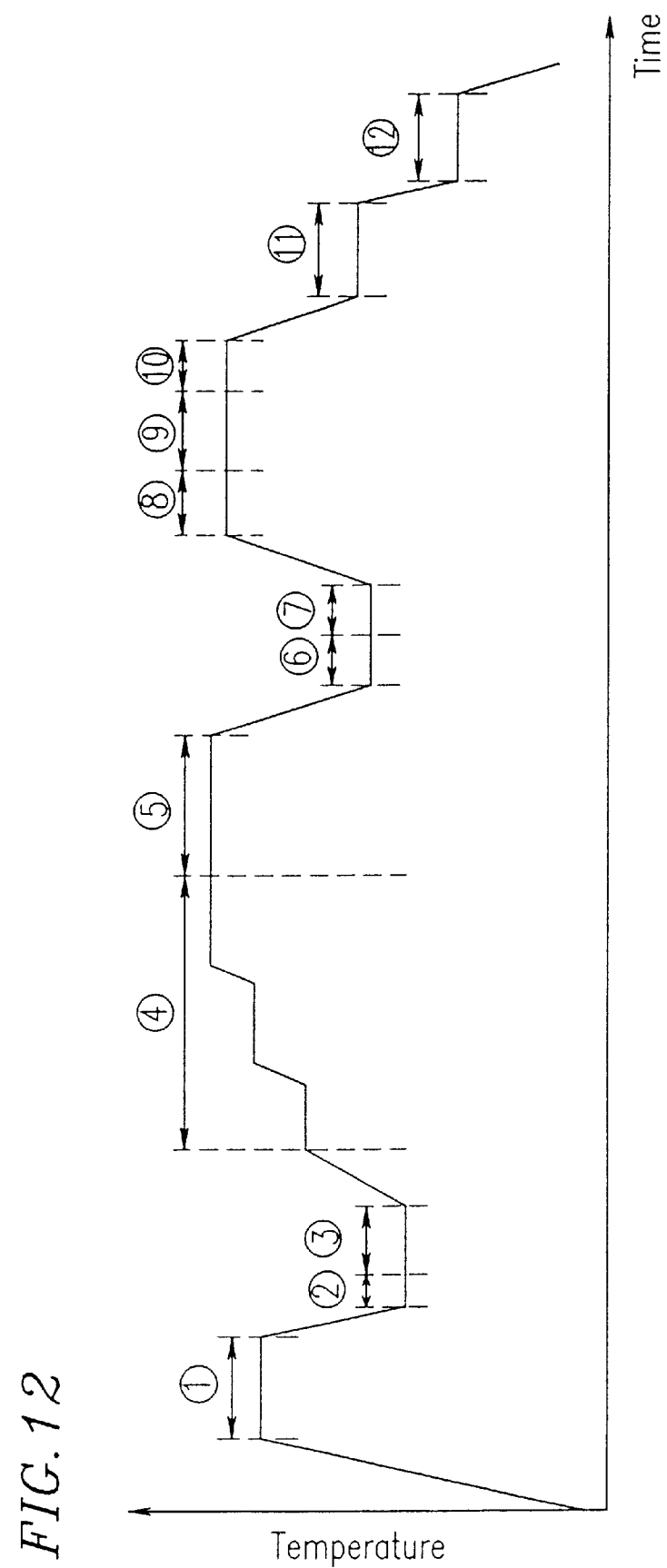
FIG. 12 is a graph illustrating the crystal growth sequence for fabricating the light-emitting element of the present invention.

A method for fabricating a gallium nitride group compound semiconductor light-emitting element by using the method for producing the gallium nitride group compound semiconductor as described in the first and second embodiments will be described with reference to FIGS. 11 and 12. In this embodiment, sapphire is used as a material for the substrate. It should be noted that an MOVPE method is used for forming crystalline layers. FIG. 12 illustrates the growth sequence of the crystalline layers.

First, in order to perform a crystal growth, a sapphire (single crystalline $Al_2O_3$) C-plane substrate 10 is disposed on a susceptor in a reactor of an MOVPE apparatus (not shown), an evacuation is performed, and then the substrate is heated at about 1050° C. for about 15 minutes within a hydrogen environment at about 70 Torr, thereby subjecting the surface of the substrate 10 to a cleaning treatment (as represented by ① in FIG. 12).

Next, after the substrate 10 has been cooled down to about 600° C., ammonium is supplied for about 1 minute at a flow rate of about 2.5 L/min., thereby nitrifying the surface of the substrate 10 (as represented by ② in FIG. 12). Thereafter, trimethylgallium (TMG), ammonium and carrier hydrogen are supplied at the respective flow rates of 20 umol/min., about 2.5 L/min. and about 2 L/min., thereby depositing a GaN layer in a polycrystalline state (or a polycrystalline GaN layer) 11a to be about 50 nm thick, as shown in FIG. 11 (and as represented by ③ in FIG. 12).

Then, in order to form a satisfactory single crystalline GaN layer on the polycrystalline GaN layer 11a, the three-stage crystal growth process is performed as described in the first and second embodiments (and as represented by ④ in FIG. 12). More specifically, only the supply of TMG is suspended and the substrate temperature is raised to about 950° C. Thereafter, TMG is supplied again at a flow rate of about 20 μmol/min., thereby depositing a nucleus layer of GaN single crystals (the first stage). Next, by gradually raising the substrate temperature from about 950° C. to about 1050° C. and then to about 1090° C. while continuously supplying TMG, a single crystalline GaN layer 11c is grown (the second and third stages). The polycrystalline GaN layer 11a and the single crystalline GaN layer 11c form a GaN buffer layer 11 shown in FIG. 11.

Subsequently, monosilane (hydrogen-based, about 50 ppm) and trimethylaluminum (TMA) are additionally supplied at the respective flow rates of about 10 cc/min. and about 2 μmol/min., thereby depositing an n-type AlGaN cladding layer 12 (as represented by ⑤ in FIG. 12).

Thereafter, only the supplies of TMG, TMA and monosilane are suspended and the substrate temperature is lowered to about 700° C. within mixture environment of ammonium and hydrogen. After the substrate temperature has stabilized, trimethylindium (TMI) and TMG are supplied at the respective flow rates of about 200 μmol/min. and 20 μmol/min., thereby depositing an active layer 13 composed of InGaN mixed crystals to be about 10 nm thick (as represented by ⑥ in FIG. 12). The temperature range defined for forming the InGaN active layer 13 may be from about 500° C. to about 800° C., both inclusive. The active layer may be composed of $Al_xGa_yIn_zN$ (where $0 \leq x < 1$, $0 \leq y < 1$, $0 < z \leq 1$ and $x+y+z=1$).

Next, only the supply of TMI is suspended and the flow rates of TMG and ammonium are maintained, thereby depositing an undoped GaN cap layer (or a layer for suppressing the evaporation of the InGaN active layer) 30 to be about 1 nm thick (as represented by ⑦ in FIG. 12). In this case, the flow rate of TMG may be varied.

Then, after the supply of TMG is also :/spended, the substrate temperature is raised up to about 1100° C. to about 1090° C. within the mixture environment of ammonium and hydrogen and a heat treatment is performed for about 10 minutes (as represented by ⑧ in FIG. 12).

Subsequently, TMA and TMG are supplied at the same flow rates as those described above and cyclopentadienyl-magnesium ($Cp_2Mg$) is also supplied at a flow rate of about 0.1 μmol/min., thereby depositing a p-type AlGaN cladding layer 14 (as represented by ⑨ in FIG. 12). Thereafter, only the supply of TMA is suspended, thereby depositing a p-type GaN contact layer 15 (as represented by ⑩ in FIG. 12). Next, the supplies of TMG and $Cp_2Mg$ are suspended, the substrate temperature is lowered to about 600° C. and then TMG, TMI and $Cp_2Mg$ are supplied again, thereby depositing an intermediate layer 31 (thickness: about 0.01 μm to about 1 μm) composed of p-type $In_xGa_{1-x}N$ (where $0<x<1$) (as represented by ⑪ in FIG. 12). Since the band gap of the p-type InGaN intermediate layer 31 is small, the schottky barrier between the p-type InGaN intermediate layer 31 and a p-side electrode (Pt) to be formed thereon can be reduced so that the resistance can be considerably reduced.

Next, after the substrate is cooled down to about 500° C. within mixture environment of ammonium and hydrogen, the supply of ammonium is suspended and a heat treatment is performed for about 5 minutes within hydrogen environment (as represented by ⑫ in FIG. 12).

Finally, in accordance with the known techniques, the n-type AlGaN cladding layer 12, the InGaN active layer 13, the undoped GaN cap layer 30, the p-type AlGaN cladding layer 14, the p-type GaN contact layer 15 and the p-type InGaN intermediate layer 31 are partially etched, and an n-side electrode (Al) 18 is formed on a partially exposed surface of the n-type AlGaN cladding layer 12. Also, a p-side electrode (Pt) 17 is formed on the p-type InGaN intermediate layer 31.

Alternatively, a p-type GaN guide layer 33 may be formed between the InGaN active layer 13 and the p-type AlGaN cladding layer 14, and an n-type GaN guide layer 32 may be formed between the InGaN active layer 13 and the n-type AlGaN cladding layer 12.

Hereinafter, the reasons why the undoped GaN cap layer 30 is formed will be described.

By providing the undoped GaN cap layer 30 on the InGaN active layer 13, it is possible to prevent In having a vapor pressure higher than that of the InGaN active layer 13 by several orders of magnitude from evaporating again from the InGaN active layer 13. By depositing several atomic layers of undoped GaN cap layers 30 (about 1 nm thick) at the same temperature as the deposition temperature of the InGaN active layer 13 (i.e., about 700° C.), a sharp active layer/guide layer interface is realized as shown in FIG. 13(a).

Figure 13:
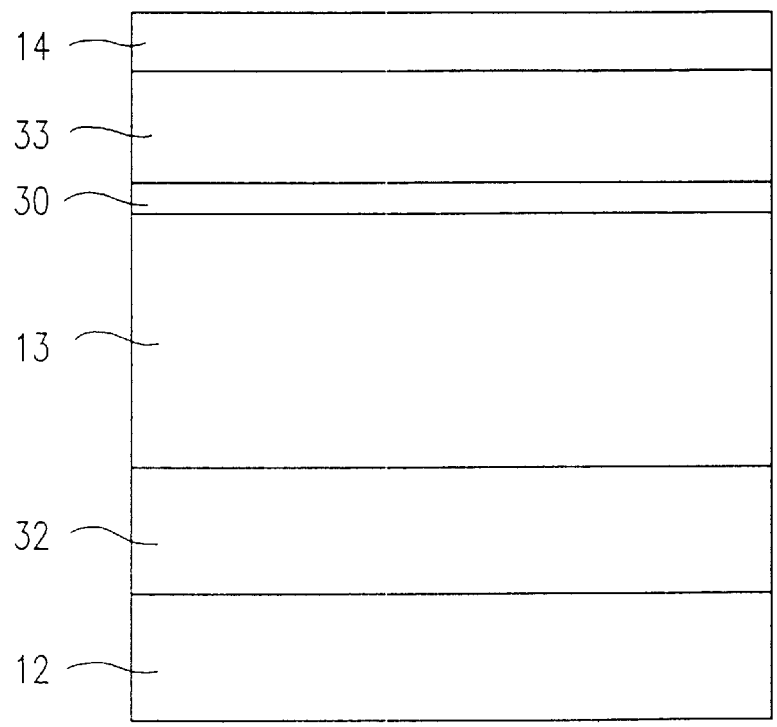
FIG. 13(a) is a view showing the interface between an InGaN active layer and a p-type GaN guide layer when an undoped GaN cap layer of the present invention is used therein.
FIG. 13(b) is a view showing a conventional interface between an InGaN active layer and a p-type GaN guide layer.
Figure 13:
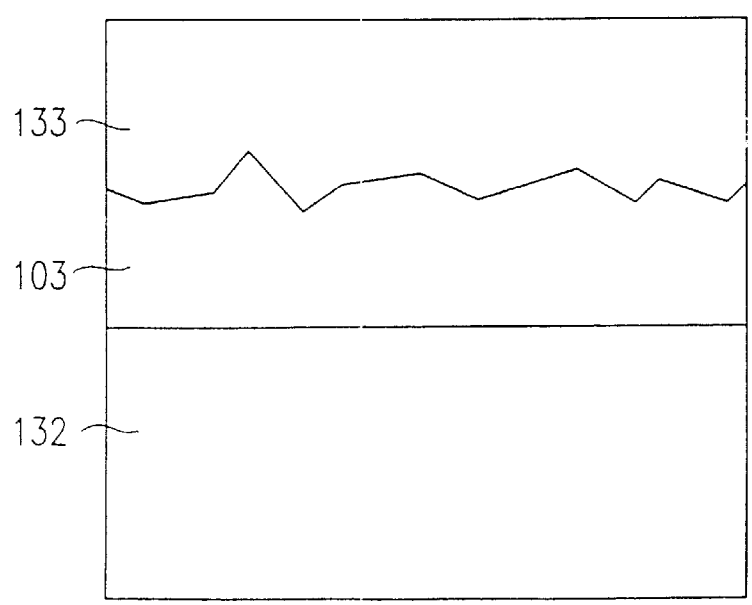

FIG. 13(b) shows the profile of an InGaN active layer 103, and an n-type guide layer 132 and a p-type guide layer 133 which sandwich the InGaN active layer 103 in a conventional structure in which no undoped GaN cap layer 30 is formed. As shown in FIG. 13(b), the interface between the InGaN active layer 103 and the p-type GaN guide layer 133 is not a sharp interface but lacks in flatness.

Furthermore, by forming the undoped GaN cap layer 30, In can be effectively mixed into the InGaN active layer. Since the InGaN active layer 13 is deposited at such a low temperature as about 700° C., the crystallinity (such as a degree of alignment) of the InGaN active layer 13 is unsatisfactory. By providing a layer for suppressing the re-evaporation of In (i.e., the undoped GaN cap layer 30) on the InGaN active layer 13 at a low temperature of about 700° C. as in this embodiment, a sufficient heat treatment can be performed on the InGaN active layer 13 by raising the substrate temperature to about 1090° C. As a result, the degree of alignment of the InGaN active layer 13 can be improved.

Figure 14:
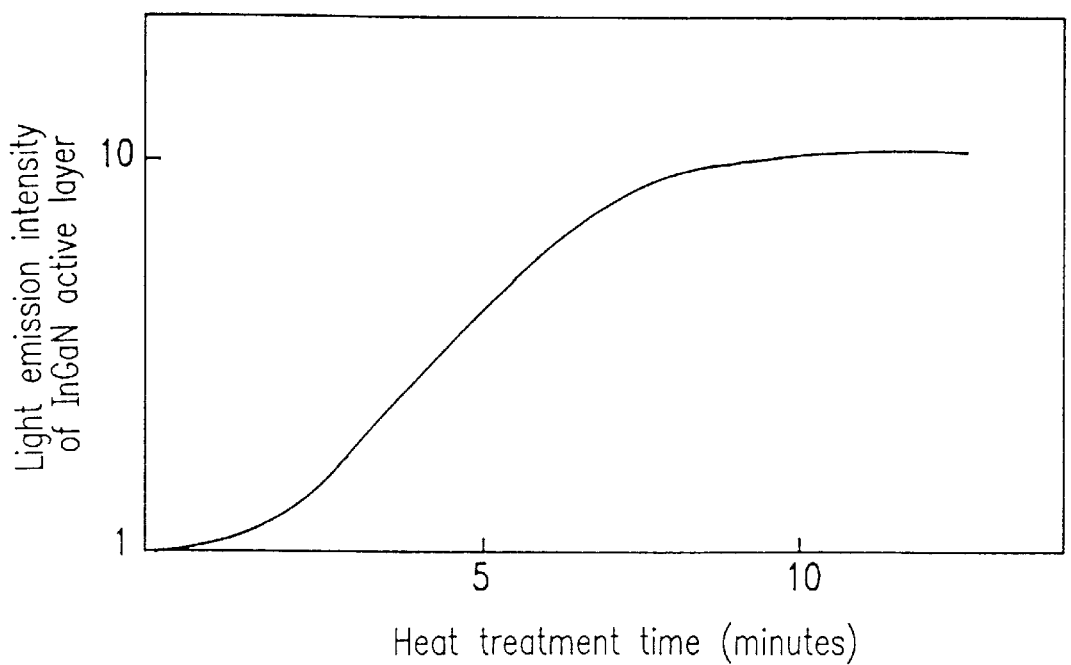
FIG. 14 is a graph illustrating the relationship between the luminous efficiency of the InGaN layer and a heat treatment time in accordance with the present invention.

FIG. 14 illustrates the relationship between the light emission intensity of the InGaN active layer 13 at room temperature and a heat treatment time of the InGaN active layer 13. As can be confirmed from FIG. 14, as the heat treatment time becomes longer, the light emission intensity is increased by about one order of magnitude and the luminous efficiency is considerably improved.

Figure 15:
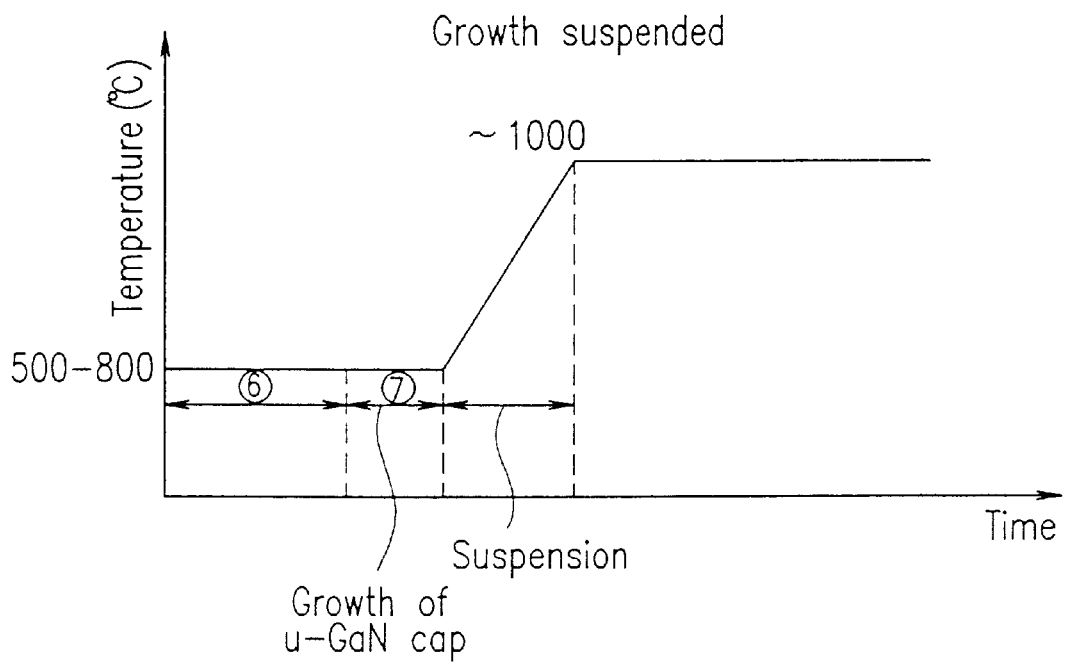
FIGS. 15(a) and 15(b) are graphs illustrating the sequences for forming the undoped GaN cap layer of the present invention for a case where the crystal growth is suspended and a case where the crystal growth is not suspended, respectively.
Figure 15:
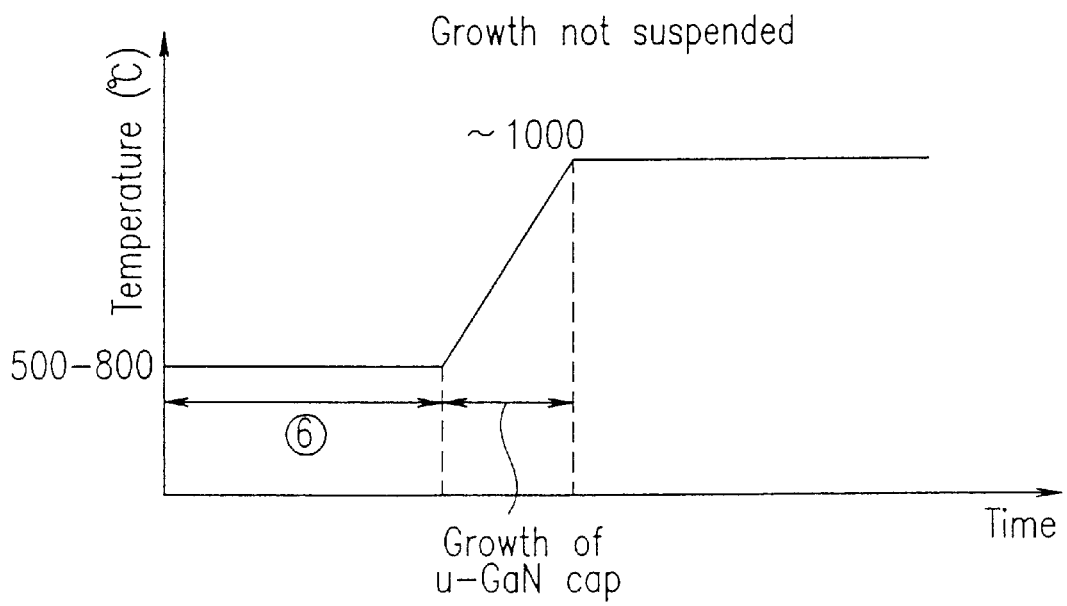

In the foregoing description, as shown in FIG. 15(a), after the undoped GaN cap layer 30 is formed at a temperature of about 500° C. to about 800° C. (as represented by ⑦), the supply of TMG is suspended, i.e., the crystal growth is suspended. Thereafter, by raising the substrate temperature up to the range of about 1000° C. to about 1090° C., a heat treatment is performed. Alternatively, as shown in FIG. 15(b), after the InGaN active layer 13 is formed at a temperature in the range of about 500° C. to about 800° C. (as represented by ⑥), only the supply of TMI may be suspended and the substrate temperature may be raised up to the range of about 1000° C. to about 1090° C. That is to say, the undoped GaN cap layer 30 may be grown while raising the substrate temperature.

The thickness of the undoped GaN cap layer 30 has only to be 10 nm or less, and more preferably in the range from about 1 nm to about 3 nm. If the thickness of the undoped GaN cap layer 30 is too small (1 nm or less), the evaporation of In cannot be suppressed sufficiently. On the other hand, if the thickness of the undoped GaN cap layer 30 is too large (3 nm or more), then the serial resistance of a device becomes high and a sufficient amount of current cannot be supplied for obtaining light emission. It should be noted that the GaN cap layer 30 may be doped with an impurity so long as it is possible to suppress the evaporation of In from the InGaN active layer 13.

EXAMPLE 4

Hereinafter, a gallium nitride group compound semiconductor light-emitting element will be described as a fourth embodiment with reference to FIG. 16. In this embodiment, not sapphire but silicon carbide (SiC) having a 6H structure is used as a material for the substrate 410. The SiC substrate 410 is doped with nitrogen and has an n-conductivity type. The SiC substrate 410 is inclined about 3.5 degrees away from the (0001) plane toward the [11-20] direction. Alternatively, similar effects can also be attained if the SiC substrate 410 is inclined about 3.5 degrees away from the (0001) plane toward the [1-100] direction.

Figure 16:
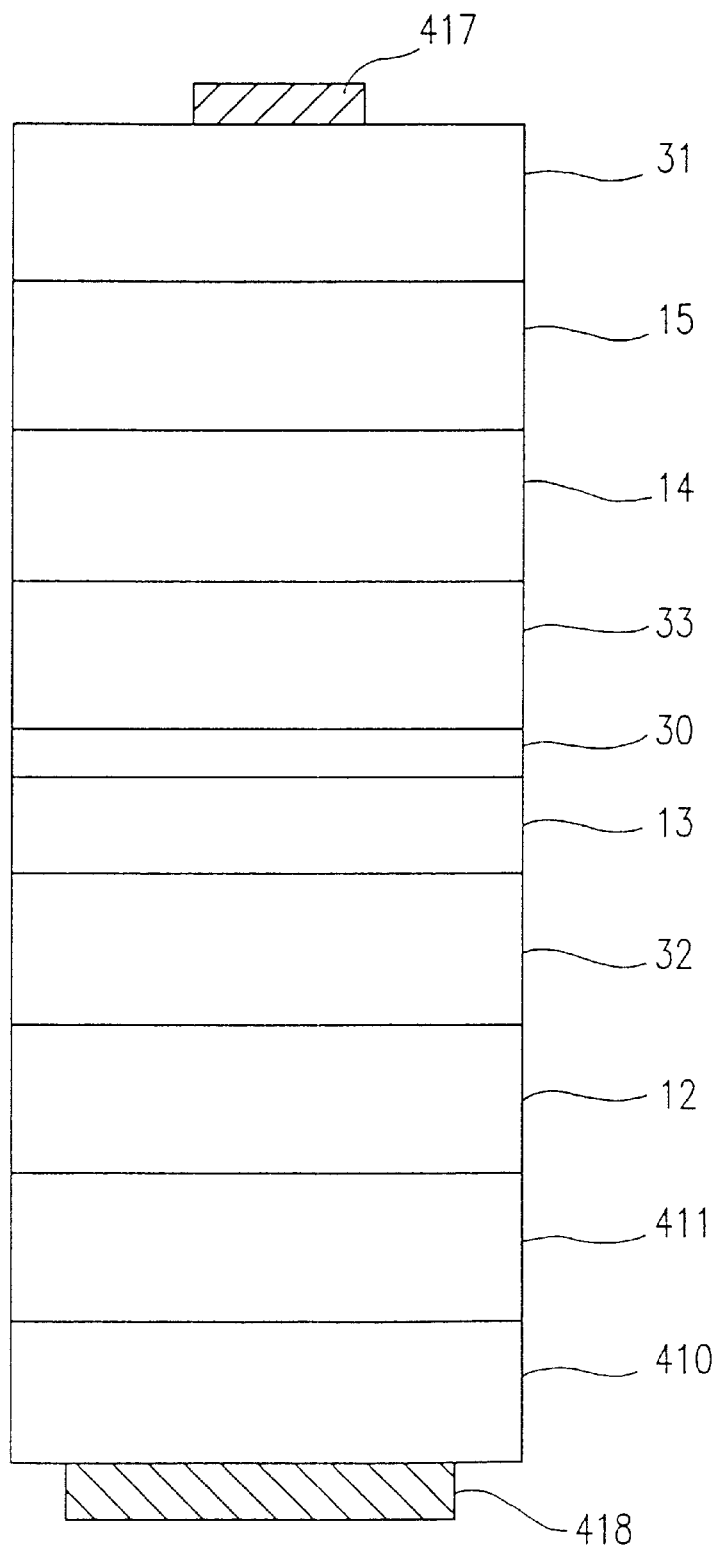
FIG. 16 is a cross-sectional view showing the structure of a light-emitting element using a silicon carbide substrate in accordance with the present invention.

FIG. 16 schematically shows the cross section of the semiconductor light-emitting element of this embodiment. As shown in FIG. 16, the semiconductor light-emitting element includes: the SiC substrate 410; an AlN buffer layer 411 formed on the substrate 410; a semiconductor multi-layer structure 419 formed on the buffer layer 411; a p-type InGaN intermediate layer 31 formed on the semiconductor multi-layer structure 419; and a pair of electrodes 417 and 418 for supplying current required for emission (i.e., drive current).

The semiconductor multi-layer structure 419 includes: an n-type AlGaN cladding layer 12; an n-type GaN guide layer 32; an InGaN active layer 13; a p-type GaN guide layer 33; a p-type AlGaN cladding layer 14; and a p-type GaN contact layer 15, these layers being sequentially stacked in this order on the buffer layer 411.

Next, a method for fabricating the gallium nitride group compound semiconductor light-emitting element will be described. In this embodiment, the buffer layer 411 is deposited by a method different from the method for forming the buffer layer as described in the first and second examples such that the buffer layer 411 has a satisfactory conductivity. In this embodiment, a metalorganic vapor phase epitaxy (MOVPE) method is used for depositing the semiconductor crystalline layers on the substrate 410.

First, in order to perform a crystal growth, the 6H silicon carbide substrate 410 is disposed on a susceptor in a reactor of an MOVPE apparatus (not shown), an evacuation is performed, and then the substrate is heated at about 1050° C. for about 15 minutes within hydrogen environment at about 70 Torr, thereby subjecting the surface of the substrate 410 to a cleaning treatment.

Next, after the substrate 410 has been cooled down to about 1000° C., ammonium is supplied for about 1 minute at a flow rate of about 2.5 L/min., thereby nitrifying the surface of the substrate 410. Thereafter, trimethylaluminum (TMA), ammonium, monosilane (hydrogenbased, about 50 ppm) and carrier hydrogen are supplied at the respective flow rates of about 10 $\mu$mol/min., about 2.5 L/min., about 10 cc/min. and about 2 L/min., thereby depositing the n-type AlN buffer layer 411 to be about 200 nm thick.

By making the buffer layer 411 have an n-type, the electrical resistance does not become high even when an n-side electrode is provided on the reverse side of the substrate 410. Since the n-type AlN buffer layer 411 has been deposited at a high temperature of about 1000° C., the buffer layer 411 has few crystal defects, is almost single crystalline and has a satisfactory conductivity. The temperature range for depositing the n-type AlN buffer layer 411 is preferably from about 800° C. to about 1200° C., both inclusive. If the deposition temperature is lower than 800° C., the degree of alignment of the n-type AlN buffer layer 411 becomes inferior and satisfactory crystallinity cannot be obtained. On the other hand, if the deposition temperature is higher than 1200° C., the crystallinity of the n-type AlN buffer layer 411 becomes inferior owing to the re-evaporation of Al and N.

A single crystalline GaN layer may be formed on the AlN buffer layer 411 by the method described in the second embodiment. In such a case, the AlN buffer layer and the single crystalline GaN layer form the buffer layer 411.

Subsequently, the flow rate of trimethylaluminum (TMA) is changed into about 2 $\mu$mol/min., and monosilane (hydrogen-based, about 50 ppm) and trimethylgallium (TMG) are additionally supplied at the respective flow rates of about 10 cc/min. and about 20 $\mu$mol/min., thereby depositing an n-type AlGaN cladding layer 12.

Thereafter, only the supply of TMA is suspended, thereby depositing the n-type GaN guide layer 32. Then, only the supplies of TMG and monosilane are suspended and the substrate temperature is lowered to about 700° C. within mixture environment of ammonium and hydrogen. After the substrate temperature has stabilized, trimethylindium (TMI) and TMG are supplied at the respective flow rates of about 200 $\mu$mol/min. and about 20 $\mu$mol/min., thereby depositing an active layer 13 composed of InGaN mixed crystals to be about 10 nm thick. The temperature range defined for forming the InGaN active layer 13 may be in the range from about 500° C. to about 800° C., both inclusive. The active layer may be composed of $Al_xGa_yIn_zN$ (where $0<x<1$, $0 \leq y<1$, $0<z \leq 1$ and $x+y+z=1$).

Next, only the supply of TMI is suspended and the flow rates of TMG and ammonium are maintained, thereby depositing an undoped GaN cap layer (or a layer for suppressing the evaporation of the InGaN active layer) 30 to be about 1 nm thick. In this case, the flow rate of TMG may be varied.

The reasons why the undoped GaN cap layer 30 is formed after the InGaN active layer 13 has been deposited are as follows. By providing the undoped GaN cap layer 30, it is possible to prevent In, having a vapor pressure higher than that of the InGaN active layer 13 by several orders of magnitude, from evaporating again from the InGaN active layer 13. By depositing several atomic layers of undoped GaN cap layers 30 (about 1 nm thick) at the same temperature as the deposition temperature of the InGaN active layer 13 (i.e., about 700° C.), a sharp interface is realized between the active layer and the guide layer to be formed subsequently.

Then, after the supply of TMG is also suspended, the substrate temperature is raised up to the range of about 1000° C. to about 1090° C. within the mixture environment of ammonium and hydrogen and a heat treatment is performed for about 10 minutes. Since the InGaN active layer 13 is deposited at a low temperature of about 700° C., the InGaN active layer 13 has poor crystallinity such as a degree of alignment. This heat treatment is performed for improving the degree. of alignment of the InGaN active layer 13. By providing a layer for suppressing the re-evaporation of In (i.e., the undoped GaN cap layer 30) on the InGaN active layer 13 at a low temperature of about 700° C. as in this embodiment, the substrate temperature can be raised to about 1000° C. and then a sufficient heat treatment can be performed on the InGaN active layer 13. As a result, the degree of alignment of the InGaN active layer 13 can be improved.

FIG. 14 illustrates the relationship between the light emission intensity of the InGaN active layer 13 at room temperature and a heat treatment time of the InGaN active layer 13. As can be confirmed from FIG. 14, as the heat treatment time becomes longer, the light emission intensity is increased by about one order of magnitude and the luminous efficiency is considerably improved.

Subsequently, TMG and cyclopentadienylmagnesium ($Cp_2Mg$) are supplied at the respective flow rates of about 20 $\mu$mol/min. and about 0.1 $\mu$mol/min., thereby depositing the p-type GaN guide layer 33.

Next, TMA is additionally supplied at an equal flow rate to that used for forming the n-type AlGaN cladding layer 12, thereby depositing the p-type AlGaN cladding layer 14. Thereafter, only the supply of TMA is suspended, thereby depositing the p-type GaN contact layer 15.

Next, the supplies of TMG and $Cp_2Mg$ are suspended, the substrate temperature is lowered to about 600° C. and then TMG, TMI and $Cp_2Mg$ are supplied again, thereby depositing the intermediate layer 31 (thickness: about 0.01 $\mu$m to about 1 $\mu$m) composed of p-type $In_xGa_{1-x}N$ (where $0<x<1$). Since the band gap of the p-type InGaN intermediate layer 31 is small, the schottky barrier between the p-type InGaN intermediate layer 31 and a p-side electrode (Pt) to be formed thereon can be reduced so that the resistance can be considerably reduced.

The p-type InGaN intermediate layer 31 can be formed by performing a heat treatment at about 500° C. within decompressed hydrogen environment at about 70 Torr after p-type InGaN has been deposited. In the decompressed hydrogen environment, p-type impurities can be activated by performing a heat treatment at about 400° C. or higher. In view of the dissociation of the nitrogen atoms, the heat treatment temperature is preferably as low as about 500° C.

Next, after the substrate is cooled down to about 500° C. within mixture environment of ammonium and hydrogen, the supply of ammonium is suspended and a heat treatment is performed for about 5 minutes within hydrogen environment.

Finally, an n-side electrode 418 is formed of titanium (Ti) on the side of the n-type SiC substrate 410 and a p-side electrode 417 is formed of platinum (Pt) on the side of the p-type InGaN intermediate layer 31. Pt is selected because Pt has a large work function and the barrier between the p-side electrode 417 and the p-type InGaN layer 31 can be reduced.

When the gallium nitride group compound semiconductor light-emitting element thus fabricated is laser oscillated by injecting current thereto, the resulting operating voltage thereof is as low as about 5 V. On the other hand, the operating voltage is about 30 V in a conventional light-emitting element. Thus, in this embodiment, the operating voltage of the light-emitting element can be considerably reduced.

In this embodiment, the n-type AlN buffer layer 411 having a low resistance is formed on the n-type SiC substrate 410 and the electrode 418 is formed on the reverse side of the substrate 410 having a conductivity. Thus, it is no longer necessary to etch a semiconductor multi-layer structure which has been epitaxially grown on a substrate for forming an n-side electrode as is done in prior art.

In the second embodiment and the present embodiment, a silicon carbide substrate is used. However, the present invention is not limited thereto. Alternatively, a silicon substrate on the surface of which a silicon carbide film is formed by a carbonizing treatment may also be used instead of the silicon carbide substrate. Moreover, the same effects as those attained by using a silicon carbide substrate can also be attained by a silicon substrate if the silicon substrate is inclined about 3.5 degrees away from the (111) plane toward the [110] direction.

Figure 17:
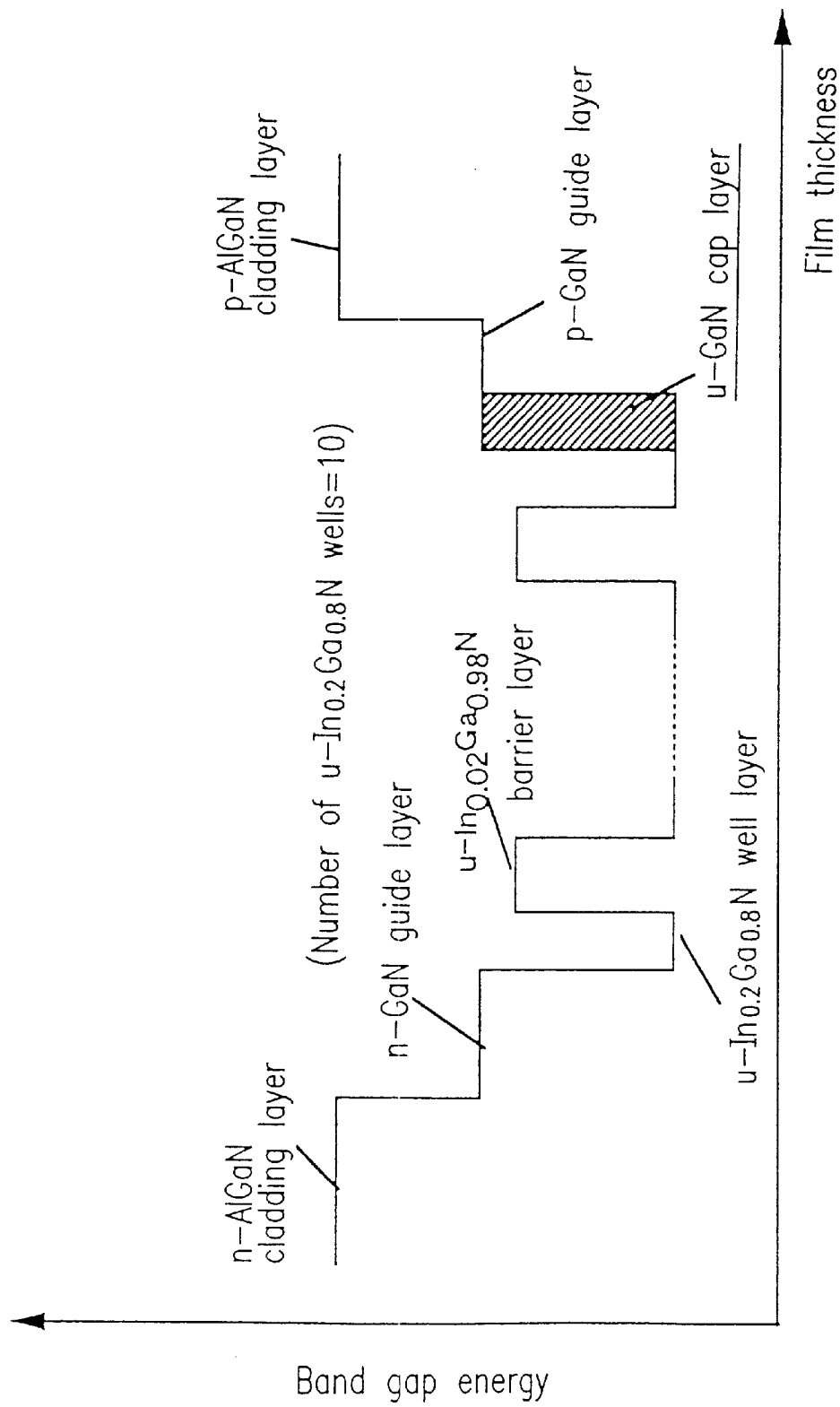
FIG. 17 is a diagram showing the structure of a multi-quantum well type light-emitting element of the present invention.

In the foregoing description, the active layer is bulk composed of InGaN or an InGaN single quantum well. However, the present invention is not limited thereto. Alternatively, the active layer may be an InGaN group multi-quantum well as shown in FIG. 17. A multi-quantum well type light-emitting element would further improve the performance of the light-emitting element.

The above-described method is used for fabricating the multi-quantum well type light-emitting element. The InGaN group multi-quantum well light-emitting element is fabricated as follows. First, an n-type GaN guide layer (thickness: about 0.1 $\mu$m) is grown on an n-type AlGaN cladding layer (thickness: about 0.5 $\mu$m) formed on a substrate. Next, $In_{0.2}Ga_{0.8}N$ well layers (thickness: about 30 Å) and $In_{0.02}Ga_{0.98}N$ barrier layers (thickness: about 50 Å) are alternately and repeatedly grown nine times thereon, and then a tenth $In_{0.2}Ga_{0.8}N$ well layer is further grown. Thereafter, an undoped GaN cap layer (thickness: about 10 Å to about 30 Å), a p-type GaN guide layer (thickness: about 0.1 $\mu$m), a p-type AlGaN cladding layer (thickness: about 0.5 $\mu$m) and a p-type GaN contact layer (thickness: about 0.3 $\mu$m) are sequentially grown on the tenth $In_{0.2}Ga_{0.8}N$ well layer.

EXAMPLE 5

Hereinafter, a gallium nitride group compound semiconductor light-emitting element will be described as a fifth embodiment of the present invention. The light-emitting element of the fifth embodiment is different from the light-emitting element of the foregoing embodiments in that, instead of Mg, carbon (C) is used as a p-type dopant for the p-type GaN guide layer and the p-type AlGaN cladding layer.

The p-type GaN guide layer is formed by supplying TMG and propane at the respective flow rates of about 20 $\mu$mol/min. and about 0.5 $\mu$mol/min. The p-type AlGaN cladding layer is formed by supplying TMA, TMG and propane at the respective flow rates of about 2 $\mu$mol/min., about 20 $\mu$mol/min. and about 0.5 $\mu$mol/min. The other deposition conditions are the same as those of the foregoing embodiments.

Figure 18:
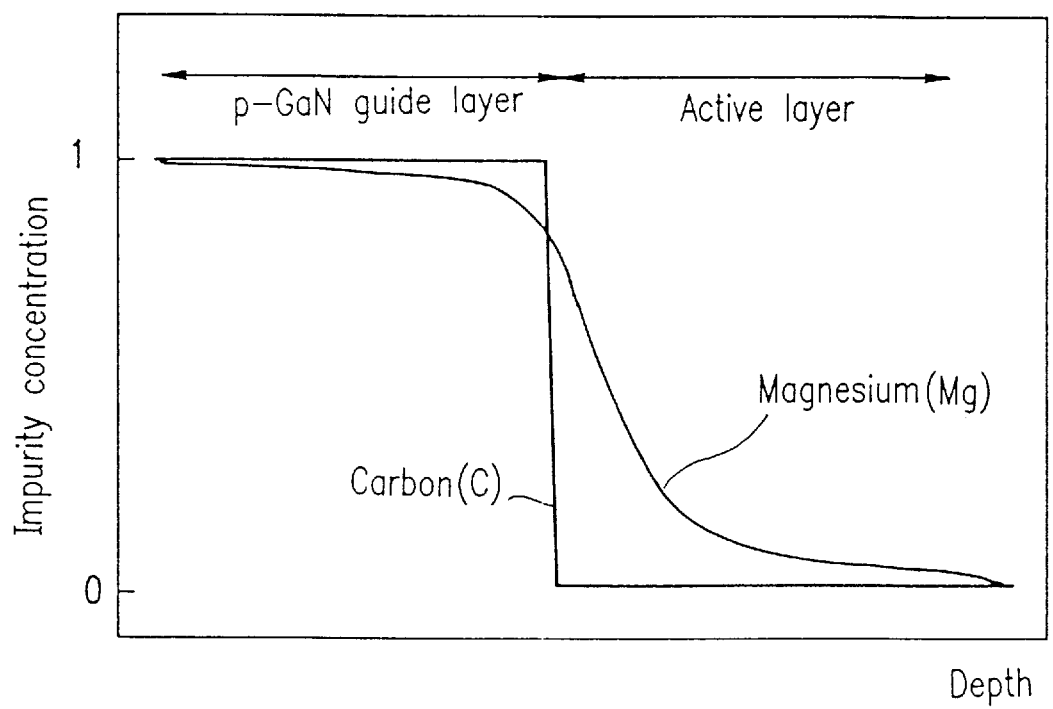
FIG. 18 is an impurity depth profile representing the diffusion of carbon (dopant of the present invention) and magnesium (conventional dopant) into an active layer.
Figure 19:
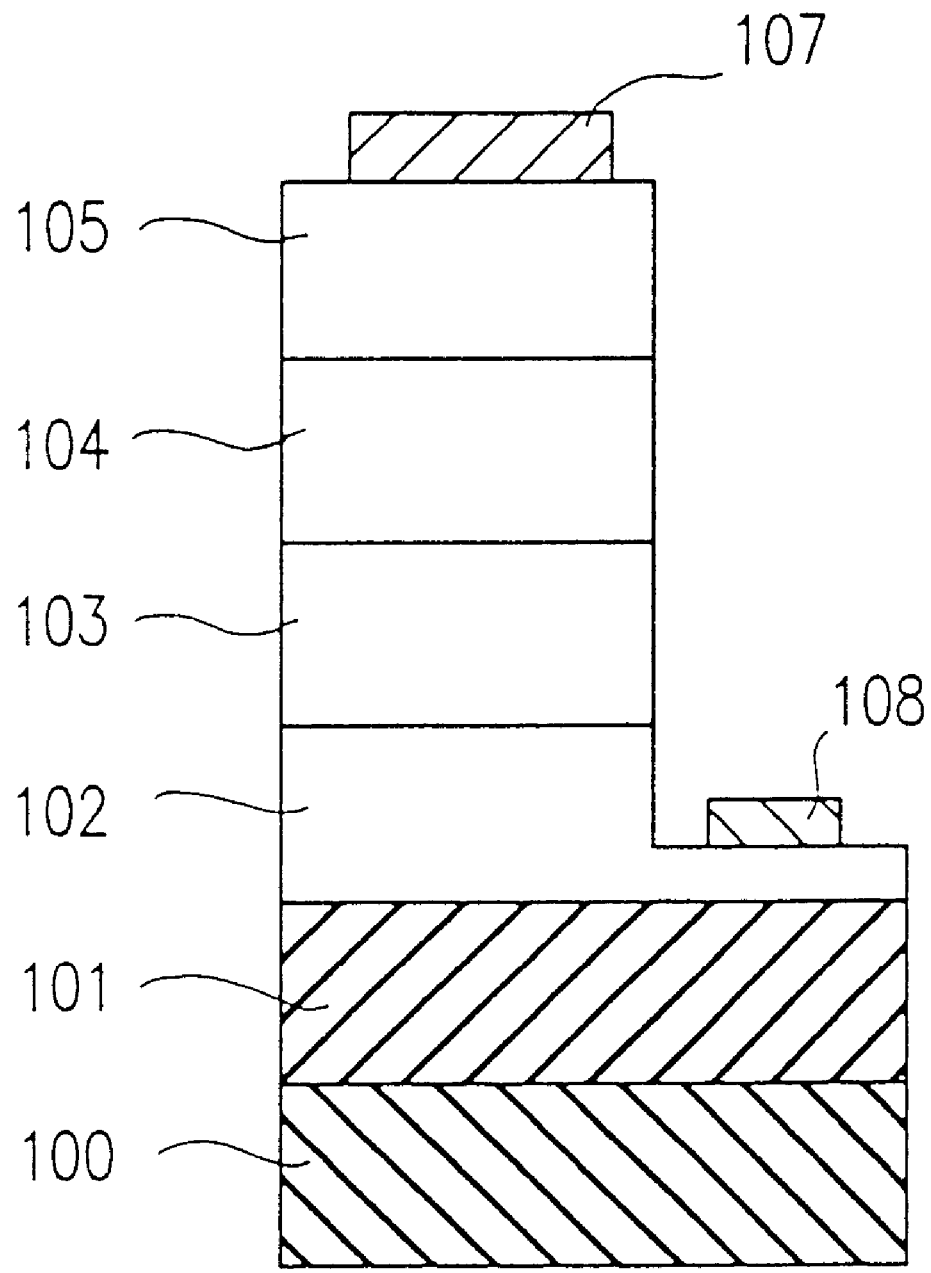
FIG. 19 is a cross-sectional view showing the structure of a conventional light-emitting element using a sapphire substrate.
Figure 20:
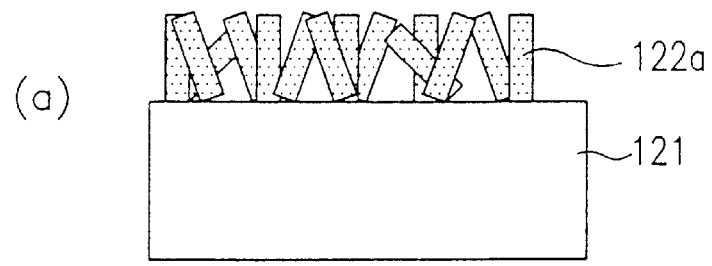
FIGS. 20(a) to 20(d) are views illustrating the process steps for producing conventional gallium nitride group compound semiconductor.
Figure 20:
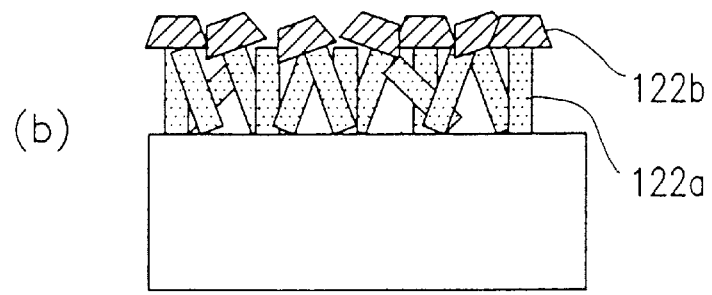
Figure 20:
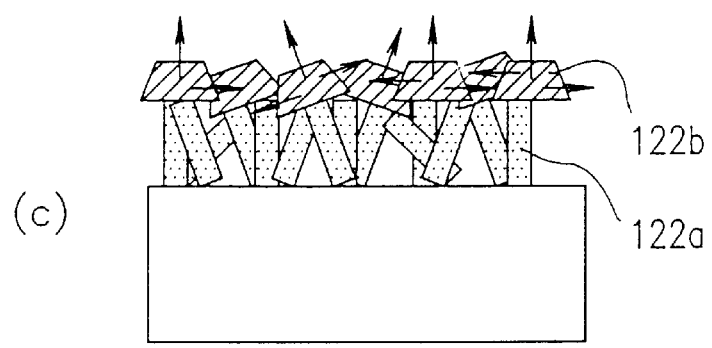
Figure 20:
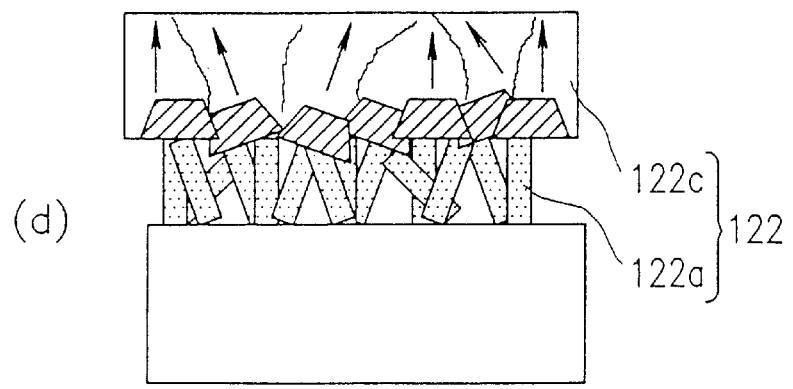
Figure 21:
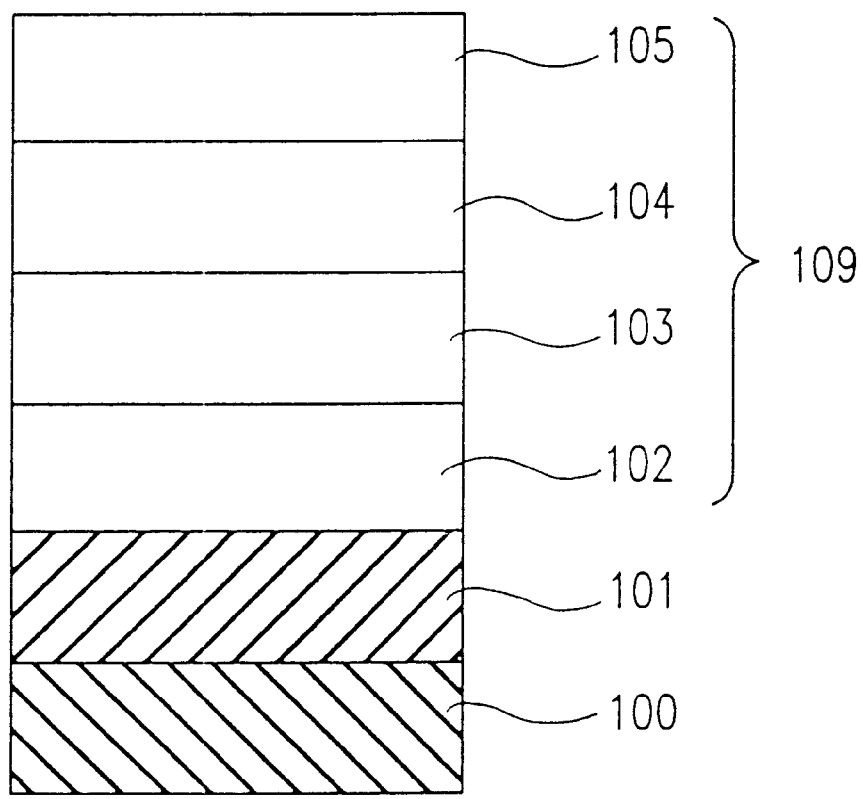
FIG. 21 is a diagram for illustrating the process steps for producing a conventional light-emitting element.

FIG. 18 illustrates the depth profiles of the p-type impurity density in the p-type GaN guide layer and the InGaN active layer. As shown in FIG. 18, magnesium (Mg) or a p-type impurity diffuses into the active layer during the growth of the GaN guide layer in a conventional light-emitting element. On the other hand, in the light-emitting element of this embodiment, carbon (C) as a p-type impurity hardly diffuses into the active layer during the growth of the GaN guide layer. Thus, carbon is turned out to be a satisfactory p-type dopant.

In addition, in the p-type AlGaN cladding layer, the diffusion of a p-type dopant into the active layer by way of the GaN guide layer can be prevented by using carbon as a p-type dopant. Consequently, the reliability of a device can be improved. In the case where the GaN guide layer is undoped, only the AlGaN cladding layer may be doped with carbon. Furthermore, carbon can be effectively used as a p-type dopant not only in a light-emitting element using an inclined substrate but also in a light-emitting element using a (0001) just substrate.

INDUSTRIAL APPLICABILITY

According to the present invention, at least the following effects can be attained.

(1) A high-quality single crystalline GaN layer having an excellent degree of alignment and excellent surface flatness can be formed on a substrate. In the case of depositing a multi-layer structure of gallium nitride group compound semiconductors on the single crystalline GaN layer, a high-quality multi-layer structure can be grown. Consequently, a light-emitting element having a high efficiency can be formed.

(2) Since an n-type polycrystalline AlN layer for forming a buffer layer can be deposited at such a low temperature as about 200° C., nuclei of GaN single crystals having a higher density can be formed on the n-type polycrystalline AlN layer. Consequently, a single crystalline GaN layer having a high degree of alignment can be grown.

(3) Since a silicon carbide substrate is inclined from a (0001) plane toward a [11-20] direction, a single crystalline GaN layer having excellent surface flatness can be grown on the substrate. Furthermore, if the composition ratio of Al is increased in a p-type AlGaN layer formed on the silicon carbide substrate, it is possible to suppress the absorption ratio of a p-type dopant from being decreased.

(4) By using an n-type AlN buffer layer doped with Si, an electrical resistance can be reduced. Moreover, since an n-side electrode can be directly formed on a side of an n-type SiC substrate, the fabrication process of a light-emitting element can be considerably simplified.

(5) Since an undoped GaN cap layer is formed on an InGaN active layer, the sharpness of the interface between the InGaN active layer and a p-type GaN guide layer or between the InGaN active layer and a p-type AlGaN cladding layer can be improved. Consequently, the defects can be reduced and the efficiency and the reliability of a light-emitting element can be significantly improved.

(6) By performing a heat treatment on the InGaN active layer, the degree of alignment of the InGaN active layer can be increased. Consequently, the luminous efficiency of the light-emitting element of the present invention can be increased tenfold or more as compared with that of a conventional light-emitting element.

(7) Since a p-type InGaN layer is provided under a p-side electrode, the contact resistance of the p-side electrode can be reduced and the operating voltage of the light-emitting element can be reduced to about one-sixth of its prior art level.

(8) By using carbon as a p-type dopant for a p-type AlGaN cladding layer, the diffusion of a dopant into the InGaN active layer can be suppressed. Consequently, the reliability and the luminous efficiency of the light-emitting element can be considerably improved.

What is claim is:

1. A method for producing gallium nitride group compound semiconductor, comprising the steps of:

forming a polycrystalline nitride layer containing aluminum nitride in a first temperature range on a sapphire substrate by an ECR-CVD or an ECR sputtering method;

forming a nucleus layer of gallium nitride single crystals in a second temperature range which is higher than the first temperature range and does not fall below 700° C. or rise above 1000° C. on the polycrystalline nitride layer;

growing the nucleus layer of gallium nitride single crystals in a third temperature range which is higher than the second temperature range such that resulting crystals of the nucleus layer of gallium nitride single crystals come into contact with each other in a direction parallel to a surface of the substrate; and growing the nucleus layer of gallium nitride single crystals in a fourth temperature range which is similar to the third temperature range in a direction vertical to the surface of the substrate, wherein the third and fourth temperature ranges range between 1000° C. and 1200° C.

2. A method for producing gallium nitride group compound semiconductor according to claim 1, wherein the polycrystalline nitride layer contains $Al_xGa_{1-x}N$ (where $0 \leq x \leq 1$) and is formed by an MOVPE method.

3. A method for fabricating a gallium nitride group compound semiconductor device comprising the steps of:

forming an aluminum nitride layer having a conductivity on a surface of a silicon carbide substrate, the surface being inclined from a (0001) plane at a first angle; and forming a multi-layer structure of gallium nitride group compound semiconductors on the aluminum nitride layer.

4. A method for fabricating a gallium nitride group compound semiconductor device according to claim 3, wherein the surface of the silicon carbide substrate is inclined from a (0001) plane of the silicon carbide substrate toward a direction [11-20] at a first angle.

5. A method for fabricating a gallium nitride group compound semiconductor device according to claim 3, wherein the first angle is about 1° to about 18°.

6. A method for fabricating a gallium nitride group compound semiconductor device according to claim 3, wherein the first angle is about 5° to about 12°.

7. A method for fabricating a gallium nitride group compound semiconductor device according to claim 3, wherein the step of forming the aluminum nitride layer is performed at a temperature of about 800° C. to about 1200° C.

8. A method for fabricating a gallium nitride group compound semiconductor device according to claim 3, wherein the aluminum nitride layer is composed of single crystals.

9. A method for fabricating a gallium nitride group compound semiconductor device according to claim 3, further comprising a step of forming a single crystalline gallium nitride layer on the aluminum nitride layer.

10. A method for fabricating a gallium nitride group compound semiconductor device according to claim 3, wherein the aluminum nitride layer is doped with silicon as an impurity.

11. A gallium nitride group compound semiconductor light-emitting element comprising:

a silicon carbide substrate, the surface of which is inclined from a (0001) plane at a first angle;

an aluminum nitride layer having a conductivity which has been formed on the surface of the silicon carbide substrate; and a multi-layer structure of gallium nitride group compound semiconductors provided on the aluminum nitride layer.

12. A gallium nitride group compound semiconductor light-emitting element according to claim 11, wherein the surface of the silicon carbide substrate is inclined from a (0001) plane of the silicon carbide substrate toward a direction [11-20] at a first angle.

13. A gallium nitride group compound semiconductor light-emitting element according to claim 11, wherein the first angle is about 1° to about 18°.

14. A gallium nitride group compound semiconductor light-emitting element according to claim 11, wherein the first angle is about 5° to about 12°.

15. A gallium nitride group compound semiconductor light-emitting element according to claim 11, further comprising an electrode formed on the multi-layer structure, wherein an $In_xGa_{1-x}N$ (where $0<x<1$) layer having an opposite conductivity type to the conductivity type of the substrate is provided between the multi-layer structure and the electrode.

16. A gallium nitride group compound semiconductor light-emitting element according to claim 15, wherein the electrode is made of platinum.

17. A method for fabricating a gallium nitride group compound semiconductor light-emitting element including a multi-layer structure of gallium nitride group compound semiconductors having an $Al_xGa_yIn_zN$ (where $0 \leq x < 1$, $0 \leq y < 1$, $0 < z \leq 1$ and $x+y+z=1$) active layer formed on a substrate, comprising the steps of:

forming the active layer in a first temperature range;

forming a GaN cap layer in the first temperature range, without interposing any other layer between the active layer formed in a first temperature range and the GaN cap layer formed in the first temperature range, for suppressing an evaporation of In on the active layer; and performing a heat treatment on the active layer in a second temperature range higher than the first temperature range.

18. A method for fabricating a gallium nitride group compound semiconductor light-emitting element including a multi-layer structure of gallium nitride group compound semiconductors having an $Al_xGa_yIn_zN$ (where $0 \leq x < 1$, $0 \leq y < 1$, $0 < z \leq 1$ and $x+y+z=1$) active layer formed on a substrate, comprising the steps of:

forming the active layer in a first temperature range;

growing a GaN cap layer while raising the substrate temperature from the temperature range in which such active layer is formed to a second temperature range which is higher than said first temperature range, without interposing any other layer between the active layer and the GaN cap layer, for suppressing an evaporation of In on the active layer.

19. A method for fabricating a gallium nitride group compound semiconductor light-emitting element according to claim 17, wherein a thickness of the GaN cap layer is in the range from about 1 nm to about 10 nm, both inclusive.

20. A gallium nitride group compound semiconductor light-emitting element including a multi-layer structure of gallium nitride group compound semiconductors having an $Al_xGa_yIn_zN$ (where $0 \leq x < 1$, $0 \leq y < 1$, $0 < z \leq 1$ and $x+y+z=1$) active layer formed on a substrate, wherein a GaN cap layer for suppressing an evaporation of In is directly formed on the active layer in the same growth temperature range as that of the active layer without interposing any other layer therebetween.

21. A gallium nitride group compound semiconductor light-emitting element according to claim 20, wherein a thickness of the GaN cap layer is in the range from about 1 nm to about 10 nm, both inclusive.

22. A gallium nitride group compound semiconductor light-emitting element including a multi-layer structure of gallium nitride group compound semiconductors formed on a substrate, wherein the multi-layer structure includes an active layer, a GaN cap layer formed on the active layer without interposing any other layer therebetween, a pair of a p-type cladding layer and an n-type cladding layer, and a p-type contact layer formed above the p-type cladding layer, the pair of cladding layers sandwiching the active layer and cap layer, and wherein the p-type cladding layer contains a first p-type dopant, and the p-type contact layer contains a second p-type dopant which is different from the first p-type dopant, the first p-type dopant being carbon.

23. A gallium nitride group compound semiconductor light-emitting element according to claim 22, wherein a p-type guide layer is provided between the active layer and the p-type cladding layer opposite to interface of active layer and GaN cap layer, wherein the p-type guide layer contains the first p-type dopant.

24. A method for producing gallium nitride group compound semiconductor, comprising the steps of:

forming a polycrystalline nitride layer in a first temperature range on a substrate;

forming a nucleus layer of gallium nitride single crystals in a second temperature range on the polycrystalline nitride layer;

growing the nucleus layer of gallium nitride single crystals in a third temperature range such that resulting crystals of the nucleus layer of gallium nitride single crystals come into contact with each other in a direction parallel to a surface of the substrate; and growing the nucleus layer of gallium nitride single crystals in a fourth temperature range in a direction vertical to the surface of the substrate, wherein the fourth temperature range is higher than the third temperature range and the third temperature range is higher than the second temperature range.

25. A method for fabricating a gallium nitride group compound semiconductor light-emitting element including a multi-layer structure of gallium nitride group compound semiconductors having an $Al_xGa_yIn_zN$ (where $0 \leq x<1$, $0 \leq y<1$, $0<z \leq 1$ and x+y+z=1) active layer formed on a substrate, comprising the steps of:

forming the active layer in a first temperature range;

forming a GaN cap layer for suppressing an evaporation of In on the active layer; and performing a heat treatment on the active layer in a second temperature range higher than the first temperature range, wherein the first temperature range is from about 500° C. to about 800° C. and the second temperature range is equal to or higher than 1000° C.

* * * * *